United States Patent
Li et al.

(10) Patent No.: US 12,236,889 B2
(45) Date of Patent: Feb. 25, 2025

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Lingtong Li, Beijing (CN); Huijuan Yang, Beijing (CN); Tingliang Liu, Beijing (CN); Xiaoqing Shu, Beijing (CN); Liheng Wei, Beijing (CN); Maoying Liao, Beijing (CN); Lianbin Liu, Beijing (CN); Rendong Li, Beijing (CN); Yi Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/030,078

(22) PCT Filed: Jun. 30, 2022

(86) PCT No.: PCT/CN2022/102963
§ 371 (c)(1),
(2) Date: Apr. 4, 2023

(87) PCT Pub. No.: WO2024/000462
PCT Pub. Date: Jan. 4, 2024

(65) Prior Publication Data
US 2024/0371327 A1    Nov. 7, 2024

(51) Int. Cl.
*G09G 3/3266*    (2016.01)

(52) U.S. Cl.
CPC ... *G09G 3/3266* (2013.01); *G09G 2310/0286* (2013.01); *G09G 2310/08* (2013.01); *G09G 2330/023* (2013.01)

(58) Field of Classification Search
CPC ......... G09G 3/3266; G09G 2310/0286; G09G 3/3677
See application file for complete search history.

(56) References Cited

U.S. PATENT DOCUMENTS

| 10,991,302 | B1 | 4/2021 | Park et al. |
| 2007/0063950 | A1* | 3/2007 | Shin ..................... G11C 19/184 345/92 |

(Continued)

FOREIGN PATENT DOCUMENTS

| CN | 101681605 B | 6/2012 |
| CN | 105489185 A | 4/2016 |

(Continued)

*Primary Examiner* — Sepehr Azari
(74) *Attorney, Agent, or Firm* — Ling Wu; Stephen Yang; Ling and Yang Intellectual Property

(57) ABSTRACT

Disclosed are a display substrate and a display device. The display substrate includes a pixel circuit and a scan drive circuit, wherein the pixel circuit includes a write transistor and a scan signal line, the scan signal line is electrically connected with a control electrode of the write transistor, and the scan drive circuit includes a first scan clock signal line and a second scan clock signal line. A signal of the first scan clock signal line is a first clock signal, a signal of the second scan clock signal line is a second clock signal, and both of the first clock signal and the second clock signal are periodic clock signals. A duration of the first clock signal being a low-level signal in one period is different from a duration of the second clock signal being a low-level signal in one period.

20 Claims, 9 Drawing Sheets

(56) References Cited

U.S. PATENT DOCUMENTS

| | | | |
|---|---|---|---|
| 2007/0296682 A1* | 12/2007 | Hwang | G09G 3/3677 345/100 |
| 2009/0189679 A1* | 7/2009 | Lee | G11C 19/184 349/42 |
| 2010/0134474 A1 | 6/2010 | Watanabe | |
| 2011/0234565 A1* | 9/2011 | Morii | G09G 3/3677 377/79 |
| 2017/0213508 A1 | 7/2017 | Zhang et al. | |
| 2018/0130407 A1* | 5/2018 | Zhai | G11C 19/28 |
| 2019/0139507 A1* | 5/2019 | Li | G09G 3/3614 |
| 2019/0325845 A1 | 10/2019 | Zhu et al. | |
| 2020/0258439 A1* | 8/2020 | Li | G09G 3/3266 |
| 2020/0286573 A1* | 9/2020 | Chien | G11C 19/28 |
| 2021/0201810 A1 | 7/2021 | Feng et al. | |
| 2022/0036789 A1* | 2/2022 | Guo | G09G 3/20 |
| 2022/0172659 A1* | 6/2022 | Park | G09G 3/32 |
| 2024/0257753 A1* | 8/2024 | Zhang | G09G 3/3233 |

FOREIGN PATENT DOCUMENTS

| | | |
|---|---|---|
| CN | 108320695 A | 7/2018 |
| CN | 108538336 A | 9/2018 |
| CN | 109935212 A | 6/2019 |
| CN | 111696486 A | 9/2020 |
| CN | 112992071 A | 6/2021 |
| CN | 215577633 U | 1/2022 |
| CN | 114038380 A | 2/2022 |
| CN | 114093296 A | 2/2022 |

* cited by examiner

DISPLAY SUBSTRATE AND DISPLAY DEVICE

CROSS-REFERENCE TO RELATED APPLICATION

The present application is a U.S. National Phase Entry of International Application PCT/CN2022/102963 having an international filing date of Jun. 30, 2022, and entitled "Display Substrate and Display Device". The entire contents of the above-identified applications are hereby incorporated by reference.

TECHNICAL FIELD

The present disclosure relates to, but is not limited to, the field of display technology, and more particularly, to a display substrate and a display device.

BACKGROUND

An Organic Light Emitting Diode (OLED for short) and a Quantum-dot Light Emitting Diode (QLED for short) are active light emitting display devices and have advantages such as self-luminescence, wide viewing angle, high contrast ratio, low power consumption, very high response speed, lightness and thinness, flexibility, and low costs. With constant development of display technologies, a flexible display that uses an OLED or a QLED as a light emitting device and performs signal control by a Thin Film Transistor (TFT for short) has become a mainstream product in the field of display at present.

SUMMARY

The following is a summary of subject matter described herein in detail. The summary is not intended to limit the protection scope of claims.

In a first aspect, the display substrate is according to the present disclosure, which includes a pixel circuit and a scan drive circuit. The pixel circuit includes a write transistor and a scan signal line electrically connected with a control electrode of the write transistor. The scan drive circuit includes a first scan clock signal line and a second scan clock signal line.

A signal of the first scan clock signal line is a first clock signal and a signal of the second scan clock signal line is a second clock signal, both of the first scan clock signal line and the second scan clock signal line are periodic clock signals.

a duration of the first clock signal being a low-level signal in one period is different from a duration of the second clock signal being a low-level signal in one period.

In some possible implementations, when the first clock signal is a low-level signal, the second clock signal is a high-level signal, and when the second clock signal is a low-level signal, the first clock signal is a high-level signal.

In some possible implementations, a duration of the first clock signal being a high-level signal in one period is greater than twice of the duration of the first clock signal being a low-level signal in one period; and
a duration of the second clock signal being a high-level signal in one period is greater than twice of the duration of the second clock signal being a low-level signal in one period.

In some possible implementations, a period of the first clock signal is equal to a period of the second clock signal.

In some possible implementations, in a first time period, a rising edge of the second clock signal is earlier than a falling edge of the first clock signal, and a falling edge of the second clock signal is later than a rising edge of the first clock signal, the first time period is a time period in which the second clock signal is a high-level signal.

In a second time period, the rising edge of the first clock signal is earlier than the falling edge of the second clock signal, and the falling edge of the first clock signal is later than the rising edge of the second clock signal, wherein the second time period is a time period in which the first clock signal is a high-level signal.

In some possible implementations, the scan drive circuit includes N cascaded scan shift registers, wherein a scan shift register includes an input terminal, an output terminal, a first clock signal terminal and a second clock signal terminal, and N is a total number of rows of the pixel circuits.

An output terminal of a scan shift register in an i-th stage is electrically connected with an input terminal of a scan shift register in an (i+1)-th stage and a scan signal line of a pixel circuit in the i-th row respectively, wherein $1 \leq i < N$.

A first clock signal terminal of a scan shift register in an s-th stage is electrically connected with the second scan clock signal line, a second clock signal terminal of the scan shift register in the s-th stage is electrically connected with the first scan clock signal line, a first clock signal terminal of a scan shift register in an (s+1)-th stage is electrically connected with the first scan clock signal line, a second clock signal terminal of the scan shift register in the (s+1)-th stage is electrically connected with the second scan clock signal line, wherein $1 \leq s < N$ and s is an odd number.

In some possible implementations, the duration of the first clock signal being a low-level signal in one period is greater than the duration of the second clock signal being a low-level signal in one period.

In some possible implementations, the scan drive circuit further includes a scan initial signal line electrically connected with an input terminal of a scan shift register in a first stage; and
  when a signal of the scan initial signal line is a single pulse signal and the signal of the scan initial signal line is a low-level signal, the first clock signal is a high-level signal and the second clock signal is a low-level signal.

In some possible implementations, the duration of the signal of the scan initial signal line being a low-level signal is greater than the duration of the second clock signal being a high-level signal and is smaller than a period of the first clock signal or the second clock signal.

In some possible implementations, the display substrate further includes a control drive circuit, wherein the pixel circuit further includes a compensation transistor and a control signal line electrically connected with a control electrode of the compensation transistor, and the compensation transistor is of a transistor type different from the write transistor, the control drive circuit includes control shift registers in N/2 stages, and a control shift register includes an input terminal and an output terminal.

An output terminal of a control shift register in a j-th stage is electrically connected with a control signal line of a pixel circuit in a (2j−1)-th row, a control signal line of a pixel circuit in a 2j-th row and an input terminal of a control shift register in a (j+1)-th stage respectively, $1 \leq j < N/2$.

In some possible implementations, the pixel circuit further includes an anode reset transistor, a node reset transistor and a reset signal line, wherein the anode reset transistor is of a same transistor type as the write transistor, and the node reset transistor is of a same transistor type as the compensation transistor.

The scan signal line is electrically connected with a control electrode of the anode reset transistor, and the reset signal line is electrically connected with a control electrode of the node reset transistor.

The control drive circuit is electrically connected with reset signal lines of the pixel circuits in N rows.

End time when a signal of the reset signal line is an effective level signal is earlier than start time when a signal of a control signal line of a pixel circuit in a same row is an effective level signal.

In some possible implementations, a difference between the end time when the signal of the reset signal line is an effective level signal and the start time when the signal of the control signal line of the pixel circuit in the same row being an effective level signal is greater than a duration when the signal of the reset signal line of the pixel circuit in the same row is an effective level signal.

In some possible implementations, the display substrate further includes a control drive circuit, wherein the pixel circuit further includes a compensation reset transistor and a control signal line electrically connected with a control electrode of the compensation reset transistor, and the compensation reset transistor is of a transistor type different from the write transistor, the control drive circuit includes control shift registers in N/2 stages, wherein a control shift register includes an input terminal and an output terminal.

An output terminal of a control shift register in a j-th stage is electrically connected with a control signal line of a pixel circuit in a (2j−1)-th row, a control signal line of a pixel circuit in a 2j-th row and an input terminal of a control shift register in a (j+1)-th stage respectively, wherein 1≤j<N/2.

In some possible implementations, the pixel circuit further includes an anode reset transistor, a compensation transistor, a node reset transistor and a reset signal line; wherein the anode reset transistor, the compensation transistor and the node reset transistor are of a same transistor type as the write transistor.

The scan signal line is also electrically connected with a control electrode of the anode reset transistor and a control electrode of the compensation transistor.

The scan drive circuit is electrically connected with reset signal lines of the pixel circuits in N rows.

End time of a signal of the reset signal line being an effective level signal is earlier than start time of a signal of a scan signal line of a pixel circuit in a same row being an effective level signal.

In some possible implementations, the display substrate further includes a light emitting drive circuit, and the pixel circuit further includes a light emitting transistor and a light emitting signal line electrically connected with a control electrode of the light emitting transistor, and the light emitting transistor is of a same transistor type as the write transistor.

The light emitting drive circuit includes light emitting shift registers in N/2 stages, wherein a light emitting shift register includes an input terminal and an output terminal.

An output terminal of a light emitting shift register in the j-th stage is electrically connected with a light emitting signal line of the pixel circuit in the (2j−1)-th row, a light emitting signal line of a pixel circuit in the 2j-th row and an input terminal of a light emitting shift register in the (j+1)-th stage respectively, wherein 1≤j<N/2.

In some possible implementations, a difference between the duration of the first clock signal being a low-level signal in one period and the duration of the second clock signal being a low-level signal in one period is 0.08% to 3% of the period.

In some possible implementations, a difference between the duration of the first clock signal being a low-level signal in one period and the duration of the second clock signal being a low-level signal in one period may be about 0.05 microseconds to 0.15 microseconds.

In some possible implementations, the duration of the first clock signal being a low-level signal in one period is 30% to 35% of the period, and/or the duration of a second clock signal being a low-level signal in one period is 30% to 35% of the period.

In some possible implementations, the duration of the first clock signal being a low-level signal in one period is about 1.8 microseconds to 1.9 microseconds, and the duration of the first clock signal being a high-level signal in one period is about 3.7 microseconds to 3.8 microseconds.

In some possible implementations, the duration of the second clock signal being a low-level signal in one period is about 1.7 microseconds to 1.8 microseconds, and the duration of the second clock signal being a high-level signal in one period is about 3.8 microseconds to 3.9 microseconds.

In some possible implementations, the duration of the signal of the scan initial signal line being a low-level signal is about 4.4 microseconds to 4.6 microseconds.

In a second aspect, the present disclosure further provides a display device, including the display substrate described above.

Other aspects may be understood upon reading and understanding of the drawings and the detailed description.

BRIEF DESCRIPTION OF DRAWINGS

Accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

DETAILED DESCRIPTION

Figure 1:
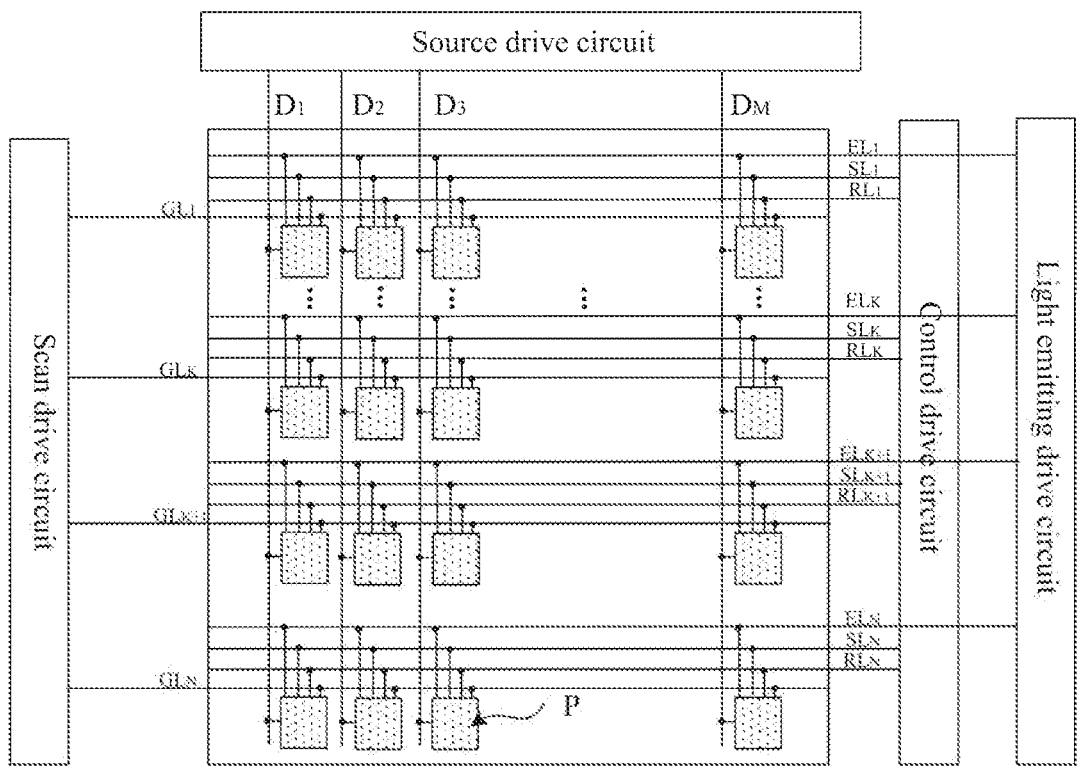
FIG. 1 is a first schematic diagram of a structure of a display substrate according to an embodiment of the present disclosure.

To make objectives, technical solutions, and advantages of the present disclosure clearer, the embodiments of the present disclosure will be described in detail with reference to the accompanying drawings. It is to be noted that implementations may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to usual designs.

Scales of the drawings in the present disclosure may be used as a reference in an actual process, but are not limited thereto. For example, a width-length ratio of a channel, a thickness and spacing of each film layer, and a width and spacing of each signal line may be adjusted according to actual needs. The number of pixels in the display substrate and the number of sub-pixels in each pixel are not limited to numbers shown in the drawings. The drawings described in the present disclosure are schematic structural diagrams only, and one implementation of the present disclosure is not limited to the shapes, numerical values or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, detachable connection, or integral connection. It may be a mechanical connection or an electrical connection. It may be a direct mutual connection, or an indirect connection through middleware, or internal communication between two components. Those of ordinary skills in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected with through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In this specification, "being disposed in a same layer" refers to a structure formed by patterning two (or more than two) structures through a same patterning process, and their materials may be the same or different. For example, materials of precursors forming multiple structures arranged in a same layer are the same, and resulting materials may be the same or different.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc.

In the present disclosure, "about" refers to that a boundary is defined not so strictly and numerical values within process and measurement error ranges are allowed.

Low Temperature Poly-Silicon (LTPS for short) technology is used in a display substrate. The LTPS technology has advantages such as high resolution, high response speed, high brightness, and high aperture ratio. Although it is favored by the market, the LTPS technology also has some defects, such as a relatively high production cost and relatively large power consumption. At this time, a technology solution of Low Temperature Polycrystalline Oxide (LTPO for short) came into being. Compared with the LTPS technology, in the LTPO technology a leakage current is smaller, pixel point response is faster, and an additional layer of oxide is added to a display substrate, which reduces energy consumption required for exciting pixel points, thus reducing power consumption during displaying of a screen. However, compared with display products using the LTPS technology, display products using the LTPO technology include drive circuits of N-type transistors. The N-type transistors are of a design of 1-drive-2, that is, one shift register drives two rows of pixels, so that a control signal of the N-type transistors is kept as an effective level signal for different time after pixel circuits in odd and even rows are charged, which leads to the difference in brightness of the pixels in the odd and even rows, and when the display substrate is displayed in high gray scale, fine cross striations are generated, thus reducing the display effect of the display product.

Figure 2:
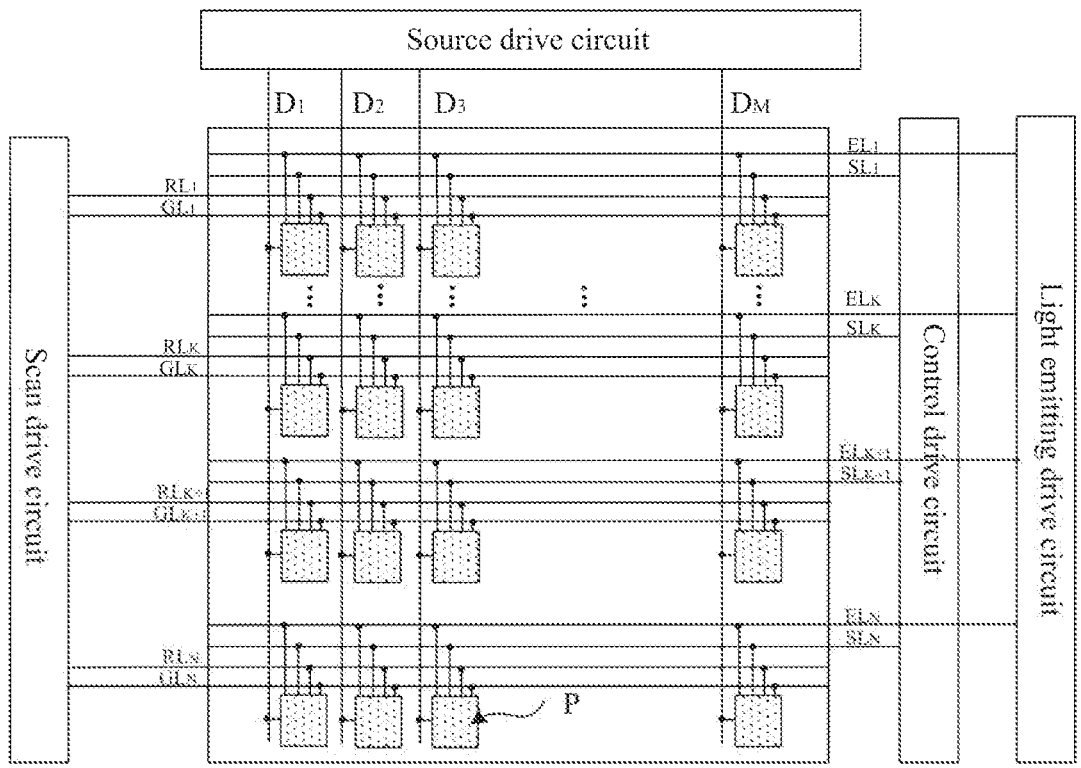
FIG. 2 is a second schematic diagram of a structure of a display substrate according to an embodiment of the present disclosure.
Figure 3:
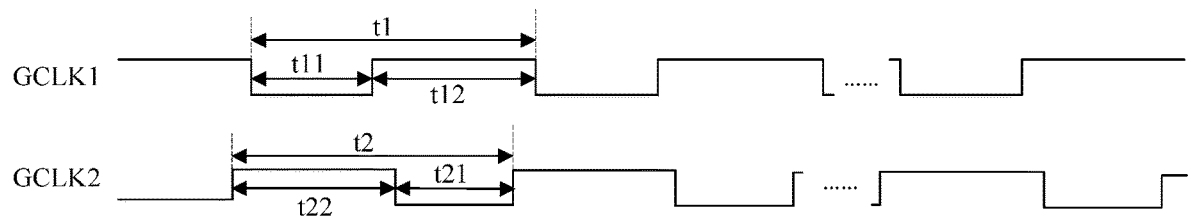
FIG. 3 is a timing diagram of two clock signal lines in a scan drive circuit.

FIG. 1 is a first schematic diagram of a structure of a display substrate according to an embodiment of the present disclosure, FIG. 2 is a second schematic diagram of a structure of a display substrate according to an embodiment of the present disclosure, and FIG. 3 is a timing diagram of two clock signal lines in a scan drive circuit. As shown in FIGS. 1 to 3, the display substrate according to the embodiment of the present disclosure includes a pixel circuit PE and the scan drive circuit. The pixel circuit includes a write transistor and a scan signal line GL, and the scan signal line GL is electrically connected with a control electrode of the write transistor. The scan drive circuit includes a first scan clock signal line GCLK1 and a second scan clock signal line GCLK2.

As shown in FIG. 3, a signal of the first scan clock signal line GCLK1 is a first clock signal and a signal of the second scan clock signal line GCLK2 is a second clock signal, both of the first clock signal and the second clock signal are periodic clock signals.

In an exemplary embodiment, a duration t11 of the first clock signal being a low-level signal in one period differs from a duration t21 of the second clock signal being a low-level signal in one period.

In an exemplary embodiment, the display substrate may be an LTPO display substrate.

In an exemplary embodiment, the period lasts for one frame, for a scan period of one or more rows of pixel circuits, for a period of the first clock signal, or for a period of the second clock signal.

In an exemplary embodiment, the display substrate may include a base substrate and a circuit structure layer disposed on the base substrate, wherein the pixel circuit and the scan drive circuit are disposed in the circuit structure layer.

In an exemplary embodiment, the display substrate may include a display area and a non-display area. The pixel circuit may be located in the display area and the scan drive circuit may be located in the display area or the non-display area, which is not limited in the present disclosure.

In an exemplary embodiment, the base substrate may be a rigid substrate or a flexible substrate, wherein the rigid substrate may be made of, but is not limited to be made of, any or both of glass and metal foil, and the flexible substrate may be made of, but is not limited to be made of, one or more of polyethylene glycol terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, the display substrate may further include a light emitting structure layer located on a side of the circuit structure layer away from the base substrate. The light emitting structure layer includes light emitting devices located in the display area and arranged in an array. A light emitting device includes a first electrode (anode), an organic light emitting layer, and a second (cathode). The anode is located on a side of the organic light emitting layer close to the base substrate, the cathode is located on a side of the organic light emitting layer away from the base substrate, and the light emitting devices are electrically connected with the pixel circuit.

In an exemplary embodiment, the light emitting devices may be Organic Light Emitting Diodes (OLED) or Quantum dot Light Emitting Diodes (QLED). An OLED may include a first electrode (anode), an organic light emitting layer, and a second electrode (cathode) that are stacked.

In an exemplary embodiment, the organic light emitting layer may include a Hole Injection Layer (HIL for short), a Hole Transport Layer (HTL for short), an Electron Block Layer (EBL for short), an Emitting Layer (EML for short), a Hole Block Layer (HBL for short), an Electron Transport Layer (ETL for short), and an Electron Injection Layer (EIL for short) that are stacked. In an exemplary embodiment, hole injection layers of all sub pixels may be connected with to form a common layer, electron injection layers of all the sub pixels may be connected with to form a common layer, hole transport layers of all the sub pixels may be connected with to form a common layer, electron transport layers of all the sub pixels may be connected with to form a common layer, hole block layers of all the sub pixels may be connected with to form a common layer, emitting layers of adjacent sub pixels may be overlapped slightly, or may be isolated from each other, and electron block layers of adjacent sub pixels may be overlapped slightly, or may be isolated from each other.

In an exemplary embodiment, as shown in FIGS. 1 and 2, the display substrate may further include a timing controller and a source drive circuit located in the non-display area.

In an exemplary embodiment, the timing controller may provide the source drive circuit with a gray-scale value and a control signal suitable for specifications of the source drive circuit, provide the scan drive circuit with a clock signal, a scan start signal, and the like suitable for specifications of the scan drive circuit, provide a control drive circuit with a clock signal, a control start signal, and the like suitable for specifications of the control drive circuit, and provide a light emitting drive circuit with a clock signal, a light emitting stop signal, and etc. suitable for specifications of the light emitting drive circuit.

In an exemplary embodiment, the source drive circuit may generate a data voltage to be provided to data signal lines $D_1, D_2, D_3, \ldots$ and $D_N$ by using the gray-scale value and the control signal which are received from the timing controller. For example, the source drive circuit may sample the gray-scale value using the clock signal, and apply the data voltage corresponding to the gray-scale value by pixel rows to the data signal lines $D_1$ to $D_N$.

In an exemplary embodiment, the scan drive circuit may generate a scan signal that is to be provided to scan signal lines $GL_1, GL_2, GL_3, \ldots$, and $GL_M$ by the clock signal, the scan start signal, and the like received from the timing controller. For example, the scan drive circuit may sequentially provide a scan signal with an on-level pulse to the scan signal lines $GL_1$ to $GL_N$. For example, the scan drive circuit may be constructed in a form of a shift register and may generate a scan signal by sequentially transmitting the scan start signal according to a form of an on-level pulse to a next stage circuit under control of the clock signal.

In the present disclosure, due to driving characteristics of the scan drive circuit, when a duration of the first clock signal being a low-level signal in one period is different from a duration of the second clock signal being a low-level signal in one period, the scan drive circuit supplies different signals to scan signal lines of pixel circuits in adjacent rows.

The display substrate according to the embodiment of the present disclosure includes a pixel circuit and a scan drive circuit. The pixel circuit includes a write transistor and a scan signal line, wherein the scan signal line is electrically connected with a control electrode of the write transistor, the scan drive circuit includes the first scan clock signal line and the second scan clock signal line. A signal of the first scan clock signal line is the first clock signal, a signal of the second scan clock signal line is the second clock signal, and both of the first clock signal and the second clock signal are periodic clock signals. The duration of the first clock signal being a low-level signal in one period is different from the duration of the second clock signal being a low-level signal in one period. In the present disclosure, the duration of the first clock signal being a low-level signal in one period is different from the duration of the second clock signal being a low-level signal in one period, so that signals supplied to the scan signal lines of the pixel circuits in adjacent rows are different, which changes turn-on time of the write transistor, and affects writing of the data signals of the pixel circuits in the adjacent rows, so that a brightness difference and a fine cross striation phenomenon of pixels in odd and even rows can be effectively improved, and the display effect of the display substrate can be improved.

In an exemplary embodiment, as shown in FIG. 3, when the first clock signal is a low-level signal, the second clock signal is a high-level signal, and when the second clock signal is a low-level signal, the first clock signal is a high-level signal.

In an exemplary embodiment as shown in FIG. 3, in one period, the duration t12 of the first clock signal being the high-level signal is greater than twice of the duration t11 of the first clock signal being a low-level signal.

In an exemplary embodiment as shown in FIG. 3, the duration t22 of the second clock signal being a high-level signal is greater than twice of the duration t21 of the second clock signal being a low-level signal in one period.

In an exemplary embodiment as shown in FIG. 3, a period t1 of the first clock signal is equal to a period t2 of the second clock signal.

In an exemplary embodiment, the duration t12 of the first clock signal being a high-level signal is greater than twice of the duration t11 of the first clock signal being a low-level signal, the duration t22 of the second clock signal being a high-level signal is greater than twice of the duration t21 of the second clock signal being a low-level signal. On the premise that the output signal of the scan drive circuit can ensure a requirement of timing of the pixel circuit, stability of the output signal of the scan drive circuit is ensured, and reliability of the scan drive circuit is improved.

In an exemplary embodiment, as shown in FIG. 3, during a first time period, a rising edge of the second clock signal is earlier than a falling edge of the first clock signal, and a falling edge of the second clock signal is later than a rising edge of the first clock signal, wherein the first time period is a time period in which the second clock signal is a high-level signal.

In an exemplary embodiment as shown in FIG. 3, during the first time period, a time interval between the rising edge of the second clock signal and the falling edge of the first clock signal may be equal or may not be equal to a time interval between the falling edge of the second clock signal and the rising edge of the first clock signal, which is not limited in the present disclosure.

In an exemplary embodiment as shown in FIG. 3, during a second time period, the rising edge of the first clock signal is earlier than the falling edge of the second clock signal, and the falling edge of the first clock signal is later than the rising edge of the second clock signal, wherein the second time period is a time period in which the first clock signal is a high-level signal.

In an exemplary embodiment, as shown in FIG. 3, during the second time period, the time interval between the rising edge of the first clock signal and the falling edge of the second clock signal may be equal to or may not be equal to the time interval between the falling edge of the first clock signal and the rising edge of the second clock signal, which is not limited in the present disclosure.

Figure 4A:
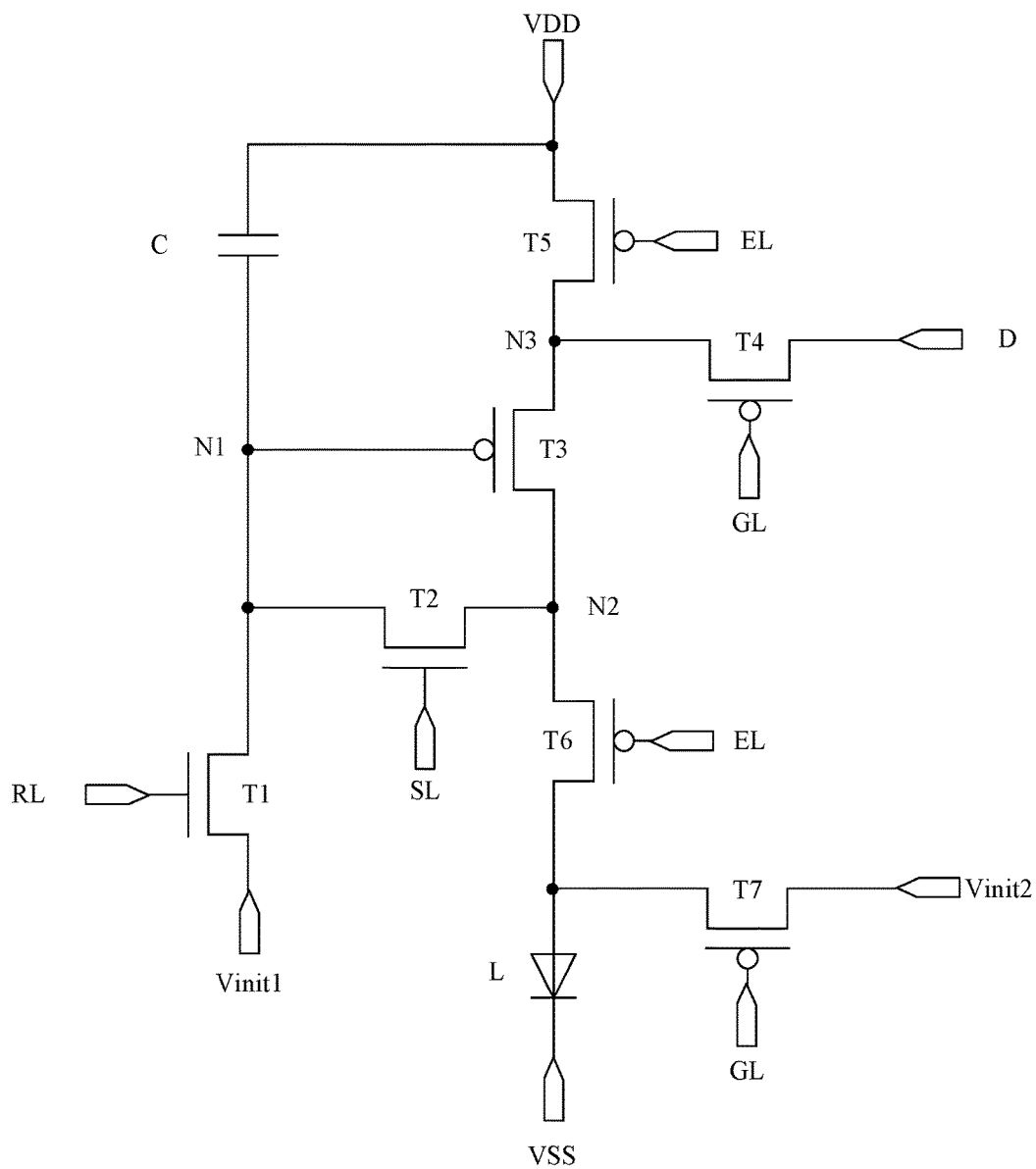
FIG. 4A is an equivalent circuit diagram of a pixel circuit.

In an exemplary embodiment, FIG. 4A is an equivalent circuit diagram of a pixel circuit. As shown in FIG. 4A, the pixel circuit may include seven transistors (a first transistor T1 to a seventh transistor T7), one capacitor C and nine signal lines (a data signal line D, a control signal line SL, a scan signal line GL, a reset signal line RL, a light emitting signal line EL, a first initial signal line Vinit1, a second initial signal line Vinit2, a first power supply line VDD, and a second power supply line VSS).

As shown in FIG. 4A, a first plate of the capacitor C is connected with the first power supply line VDD, and a second plate of the capacitor C is connected with a first node N1. A control electrode of the first transistor T1 is connected with the reset signal line RL, a first electrode of the first transistor T1 is connected with the first initial signal line Vinit1, and a second electrode of the first transistor is connected with the first node N1. A control electrode of the second transistor T2 is connected with the control signal line SL, a first electrode of the second transistor T2 is connected with the first node N1, and a second electrode of the second transistor T2 is connected with a second node N2. A control electrode of the third transistor T3 is connected with the first node N1, a first electrode of the third transistor T3 is connected with the second node N2, and a second electrode of the third transistor T3 is connected with a third node N3. A control electrode of the fourth transistor T4 is connected with the scan signal line GL, a first electrode of the fourth transistor T4 is connected with the data signal line D, and a second electrode of the fourth transistor T4 is connected with the third node N3. A control electrode of the fifth transistor T5 is connected with the light emitting signal line EL, a first electrode of the fifth transistor T5 is connected with the first power supply line VDD, and a second electrode of the fifth transistor T5 is connected with the third node N3. A control electrode of the sixth transistor T6 is connected with the light emitting signal line EL, a first electrode of the sixth transistor T6 is connected with the second node N2, and a second electrode of the sixth transistor T6 is connected with a first electrode of a light emitting device. A control electrode of the seventh transistor T7 is connected with the scan signal line GL, a first electrode of the seventh transistor T7 is connected with the second initial signal line Vinit2, a second electrode of the seventh transistor T7 is connected with the first electrode of the light emitting device, and a second electrode of the light emitting device is connected with the second power supply line VSS.

In an exemplary embodiment, the first transistor T1 may be referred to as a node reset transistor, and when an effective level signal is input to the reset signal line RL, the first transistor T1 transmits an initialization voltage to the first node N1 to initialize a charge amount at the first node N1.

In an exemplary embodiment, the second transistor T2, which may be referred to as a compensation transistor, transmits a signal from the second node N2 to the first node N1 to compensate the signal of the first node N1 when an effective level signal is input to the control signal line SL.

In an exemplary embodiment, the third transistor T3, which may be referred to as a drive transistor, determines a drive current flowing between the first power supply line VDD and the second power supply line VSS according to a potential difference between the control electrode and the first electrode of the third transistor T3.

In an exemplary embodiment, the fourth transistor T4, which may be referred to as a write transistor, enables a data voltage of the data signal line D to be input to the third node N3 when an effective level signal is input to the scan signal line GL.

In an exemplary embodiment, the fifth transistor T5 and the sixth transistor T6 may be referred to as light emitting transistors. When an effective level signal is input to the light emitting signal line EL, the fifth transistor T5 and the sixth transistor T6 enable the light emitting device to emit light by forming a path of drive current between the first power supply line VDD and the second power supply line VSS.

In an exemplary embodiment, a signal of the first power supply line VDD is a high-level signal continuously provided, and a signal of the second power supply line VSS is a low-level signal.

In an exemplary embodiment, the first transistor T1 and the second transistor T2 are metal oxide transistors and are N-type transistors, and the third transistor T3 to the seventh transistor T7 are low temperature poly-silicon transistors and are P-type transistors.

In an exemplary embodiment, the first transistor T1 and the second transistor T2 are oxide transistors and may reduce a leakage current, which improves performance of the pixel drive circuit, and may reduce power consumption of the pixel drive circuit.

Figure 4B:
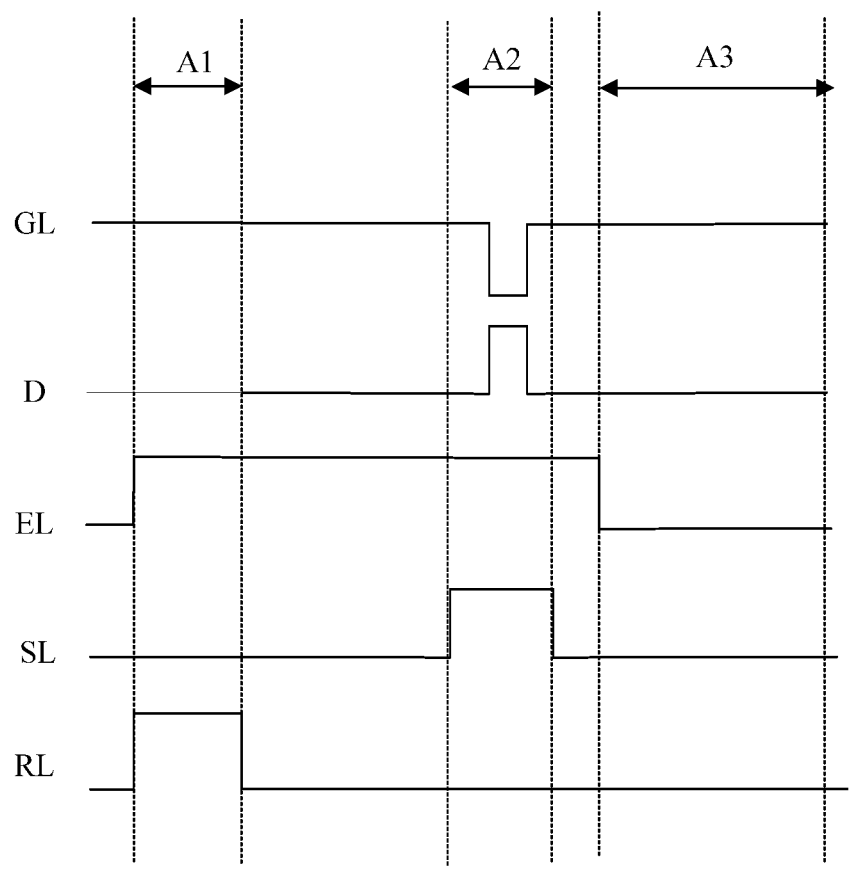
FIG. 4B is a timing diagram illustrating operation of the pixel circuit according to FIG. 4A.

FIG. 4B is a timing diagram illustrating operation of the pixel circuit according to FIG. 4A. Exemplary embodiments of the present disclosure are described below with reference to an operating process of the pixel circuit illustrated in FIG. 4B. In an exemplary embodiment, an operating process of the pixel drive circuit may include following phases.

In a first phase A1, which is referred to as a reset phase, signals of the reset signal line RL, the scan signal line GL and the light emitting signal line EL are high-level signals, and a signal of the control signal line SL is a high-level signal. The signal of the reset signal line RL is a low-level signal, so that the first transistor T1 is turned on, a signal of the first initial signal line Vinit1 is provided to the first node N1 to initialize the capacitor C, thereby clearing an original data voltage in the capacitor C. Both of the signals of the scan signal line GL and the light emitting signal line EL are high-level signals, and the signal of the control signal line SL is the low-level signal, so that the second transistor T2, the fourth transistor T4, the fifth transistor T5, the sixth transistor T6 and the seventh transistor T7 are cut off. The light emitting device L does not emit light in this phase.

In a second phase A2, which is referred to as a data writing phase or a threshold compensation phase, the signals of the scan signal line GL and the reset signal line RL are low-level signals, both of the signals of the light emitting signal line EL and the control signal line SL are high-level signals, so that the data signal line D outputs a data voltage. In this phase, the signal of the first node N1 is a low-level signal, so that the third transistor T3 is turned on. The signal of the scan signal line GL is a low-level signal, so that the fourth transistor T4 and the seventh transistor T7 are turned on. The signal of the control signal line SL is a high-level signal, so that the second transistor T2 is turned on. The second transistor T2 and the fourth transistor T4 are turned on, so that the data voltage output by the data signal line D is provided to the first node N1 through the second node N3, the turned-on third transistor T3, the second node N2 and the turned-on second transistor T2, and the capacitor C is charged with a difference between the data voltage output by the data signal line D and a threshold voltage of the third transistor T3, until a voltage at the first node N1 is Vd−|Vth|, where Vd is the data voltage output by the data signal line D, and Vth is the threshold voltage of the third transistor T3. The seventh transistor T7 is turned on, so that the initial voltage of the second initial signal line Vinit2 is provided to the first electrode of the light emitting device L to initialize (reset) the first electrode of the light emitting device L and clear a pre-stored voltage therein to complete initialization to ensure that the light emitting device L does not emit light. The signal of the reset signal line RL is a low-level signal, so that the first transistor T1 is cut off. The signal of the light emitting signal line EL is a high-level signal, so that the fifth transistor T5 and the sixth transistor T6 are cut off.

In a third phase A3, which is referred to as a light emitting phase, the signal of the light emitting signal line GL is a high-level signal, and the signals of the control signal line SL, the light emitting signal line EL and the reset signal line RL are all low-level signals. The signal of the light emitting signal line EL is a low-level signal, so that the fifth transistor T5 and the sixth transistor T6 are turned on, and a power supply voltage output by the first power supply line VDD provides a drive voltage to the first electrode of the light emitting device L through the turned-on fifth transistor T5, the third transistor T3, and the sixth transistor T6 to drive the light emitting device L to emit light.

In a drive process of the pixel circuit, a drive current flowing through the third transistor T3 (drive transistor) is determined by a voltage difference between the control electrode and the first electrode of the third transistor T3. Since the voltage at the first node N1 is Vd-|Vth|, the drive current of the third transistor T3 is as follows:

$$I=K^*(Vgs-Vth)^2=K^*[(Vdd-Vd+|Vth|)-Vth]^2=K^*[(Vdd-Vd]^2$$

where I is the drive current flowing through the third transistor T3, i.e., a drive current for driving the light emitting device, K is a constant, Vgs is the voltage difference between the control electrode and the first electrode of the third transistor T3, Vth is the threshold voltage of the third transistor T3, Vd is the data voltage output by the data signal line D, and Vdd is the power voltage output by the first power supply line VDD.

Figure 5A:
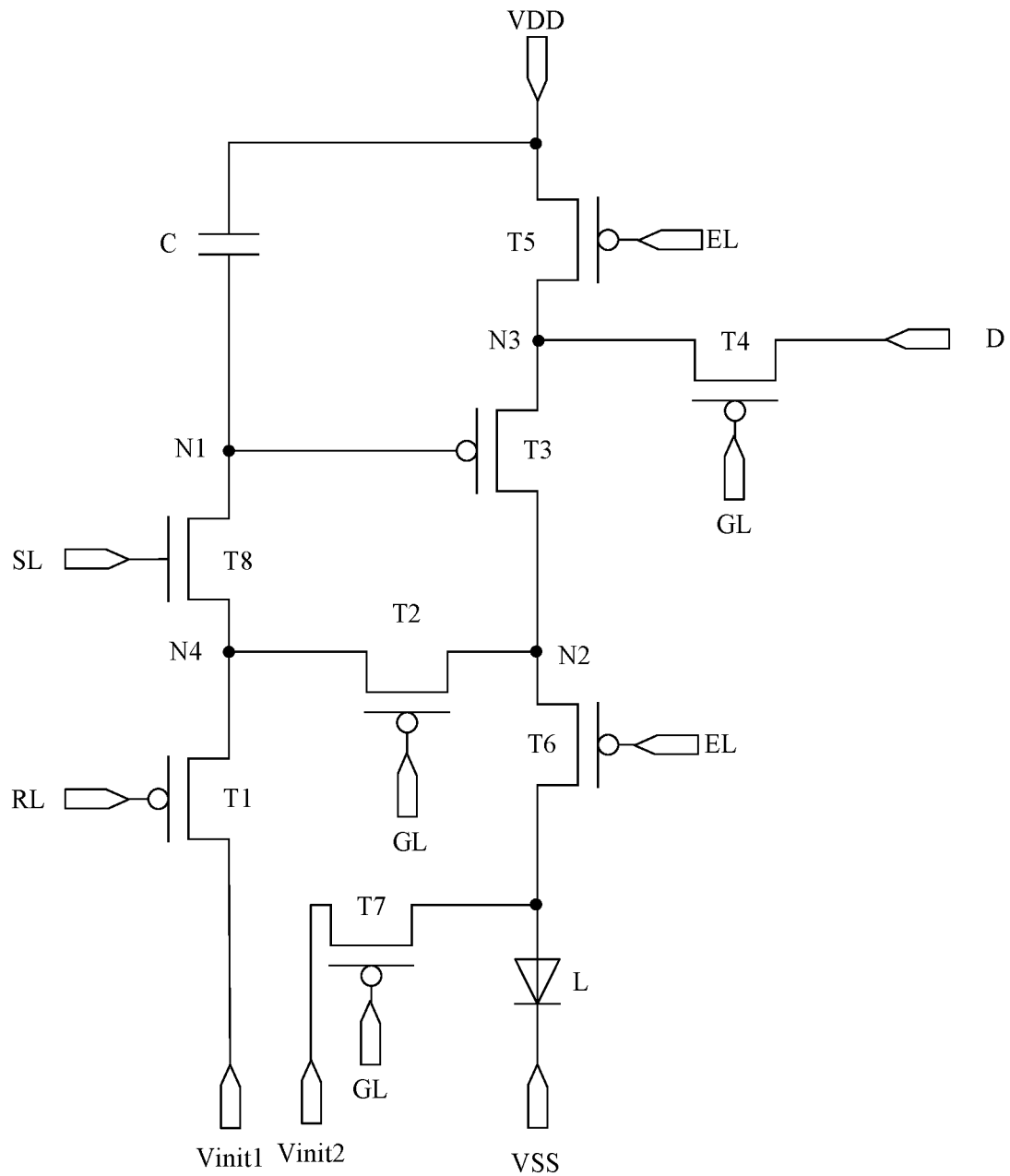
FIG. 5A is an equivalent circuit diagram of another pixel circuit.

In an exemplary embodiment, FIG. 5A is an equivalent circuit diagram of another pixel circuit. As shown in FIG. 5A, the pixel circuit may include eight transistors (a first transistor T1 to an eighth transistor T8), one capacitor C and nine signal lines (a data signal line D, a control signal line SL, a scan signal line GL, a reset signal line RL, a light emitting signal line EL, a first initial signal line Vinit1, a second initial signal line Vinit2, a first power supply line VDD, and a second power supply line VSS).

In an exemplary embodiment, a first plate of the capacitor C is connected with the first power supply line VDD, and a second plate of the capacitor C is connected with a first node N1. A control electrode of the first transistor T1 is connected with the reset signal line RL, a first electrode of the first transistor T1 is connected with the first initial signal line Vinit1, and a second electrode of the first transistor T1 is connected with a fourth node N4. A control electrode of the second transistor T2 is connected with the scan signal line GL, a first electrode of the second transistor T2 is connected with a fourth node N4, and a second electrode of the second transistor T2 is connected with a second node N2. A control electrode of the third transistor T3 is connected with the first node N1, a first electrode of the third transistor T3 is connected with the second node N2, and a second electrode of the third transistor T3 is connected with a third node N3. A control electrode of the fourth transistor T4 is connected with the scan signal line GL, a first electrode of the fourth transistor T4 is connected with the data signal line D, and a second electrode of the fourth transistor T4 is connected with the third node N3. A control electrode of the fifth transistor T5 is connected with the light emitting signal line EL, a first electrode of the fifth transistor T5 is connected with the first power supply line VDD, and a second electrode of the fifth transistor T5 is connected with the third node N3. A control electrode of the sixth transistor T6 is connected with the light emitting signal line EL, a first electrode of the sixth transistor T6 is connected with the second node N2, and a second electrode of the sixth transistor T6 is connected with a first electrode of the light emitting device L. A control electrode of the seventh transistor T7 is connected with the scan signal line GL, a first electrode of the seventh transistor T7 is connected with the second initial signal line Vinit2, a second electrode of the seventh transistor T7 is connected with the first electrode of the light emitting device L, and a second electrode of the light emitting device L is connected with the second power supply line VSS. A control electrode of the eighth transistor T8 is connected with the scan signal line SL, a first electrode of the eighth transistor T8 is connected with the first node N1, and a second electrode of the eighth transistor T8 is connected with the fourth node N4.

In an exemplary embodiment, the control electrode of the seventh transistor T7 may also be connected with the reset signal line RL, the first electrode of the seventh transistor T7 is connected with the second initial signal line Vinit2, the second electrode of the seventh transistor T7 is connected with the first electrode of the light emitting device L, and the second electrode of the light emitting device L is connected with the second power supply line VSS.

In an exemplary embodiment, the first transistor T1 may be referred to as a node reset transistor, and when an effective level signal is input to the reset signal line RL, the first transistor T1 transmits an initialization voltage to the first node N1 to initialize a charge amount at the first node N1.

In an exemplary embodiment, the eighth transistor T8 may be referred to as a compensation reset transistor, and when an effective level signal is input to the control signal line SL, the eighth transistor T8 transmits a signal of the fourth node N4 to the first node N1, so that not only a charge amount of the first node may be initialized, but also threshold compensation may be performed on the third transistor T3.

In an exemplary embodiment, the second transistor T2, which may be referred to as a compensation transistor, writes a signal of the second node N2 to the fourth node N4 when an effective level signal is input to the scan signal line GL.

In an exemplary embodiment, the third transistor T3, which may be referred to as a drive transistor, determines a drive current flowing between a first power supply signal VDD and a second power supply signal VSS according to a potential difference between the control electrode and first electrode of the third transistor T3.

In an exemplary embodiment, the fourth transistor T4, which may be referred to as a write transistor, enables a data voltage of the data signal line D to be input to the pixel circuit when an effective level signal is input to the scan signal line GL.

In an exemplary embodiment, the fifth transistor T5 and the sixth transistor T6 may be referred to as light emitting transistors. When an effective level signal is input to the light emitting signal line EL, the fifth transistor T5 and the sixth transistor T6 enable the light emitting device to emit light by forming a path of drive current between the first power supply line VDD and the second power supply line VSS.

In an exemplary embodiment, a signal of the first power supply line VDD is a high-level signal continuously provided, and a signal of the second power supply line VSS is a low-level signal.

In an exemplary embodiment, the eighth transistor T8 is a metal oxide transistor and is an N-type transistor, and the first transistor T1 to the seventh transistor T7 are low temperature poly-silicon transistors and are P-type transistors.

In an exemplary embodiment, the eighth transistor T8 is an oxide transistor and may reduce a leakage current, improve performance of the pixel circuit, and may reduce power consumption of the pixel circuit.

Figure 5B:
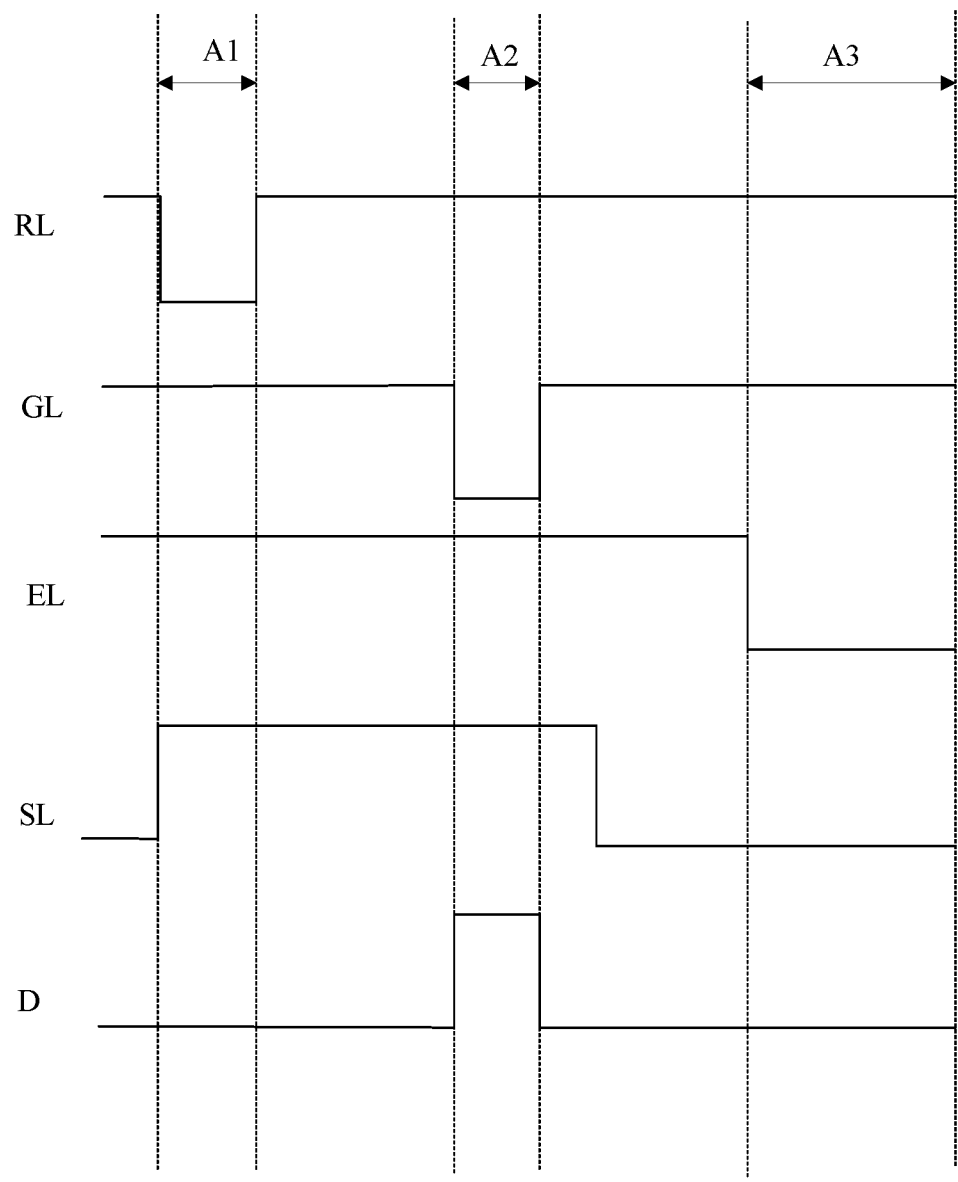
FIG. 5B is a timing diagram illustrating operation of the pixel circuit according to FIG. 5A.

FIG. 5B is a timing diagram illustrating operation of the pixel circuit according to FIG. 5A. Exemplary embodiments of the present disclosure are described below with reference to an operating process of the pixel circuit illustrated in FIG. 5B. The operating process of the pixel circuit may include the following phases.

In a first phase A1, referred to as a reset phase, signals of the control signal line SL, the light emitting signal line EL and the scan signal line GL are all high-level signals, and a signal of the reset signal line RL is a low-level signal. The signal of the reset signal line RL is the low-level signal, so that the first transistor T1 is turned on, a signal of the initial signal line Vinit1 is provided to the fourth node N4. The seventh transistor T7 is turned on, so that an initial voltage of the initial signal terminal Vinit2 is provided to a first electrode of the light emitting device L, and the first electrode of the light emitting device L is initialized (reset). For example, a pre-stored voltage in the light emitting device L is cleared up, and initialization is completed to ensure that the light emitting device L does not emit light. The signal of the control signal line SL is a low-level signal, so that the eighth transistor T8 is turned on, a signal of the fourth node N4 is provided to the first node N1 to initialize the capacitor C, thereby clearing an original data voltage in the capacitor C. The signals of the scan signal line GL and the light emitting signal line EL are high-level signals, so that the second transistor T2, the fourth transistor T4, the fifth transistor T5, the sixth transistor T6 and the seventh transistor T7 are cut off. The light emitting device L does not emit light in this phase.

In a second phase A2, which is referred to as a data writing phase or a threshold compensation phase, the signal of the scan signal line GL is a low-level signal, the signals of the reset signal line EL, the light emitting signal line EL and the control signal line SL are high-level signals, and the data signal line D outputs a data voltage. In this phase, since a signal of the first node N1 is a low-level signal, the third transistor T3 is turned on. The signal of the scan signal line GL is the low-level signal, so that the second transistor T2 and the fourth transistor T4 are turned on. The signal of the control signal terminal SL is a high-level signal, so that the eighth transistor T8 is turned on. The second transistor T2, the fourth transistor T4, and the eighth transistor T8 are turned on so that a data voltage output from the data signal line D is provided to the first node N1 through the third node N3, the turned-on third transistor T3, the second node N2, the turned-on second transistor T2, the fourth node N4, and the turned-on eighth transistor T8. A difference between the data voltage output by the data signal line D and a threshold voltage of the third transistor T3 is charged into the capacitor C until a voltage of the first node N1 is Vd−|Vth|, wherein Vd is the data voltage output by the data signal line D, and Vth is the threshold voltage of the third transistor T3. The signal of the reset signal line RL is a low-level signal, so that the first transistor T1 and the seventh transistor T7 are cut off. The signal of the light emitting signal line EL is a high-level signal, so that the fifth transistor T5 and the sixth transistor T6 are cut off.

In a third phase A3, which is referred to as a light emitting phase, both of the signals of the control signal line SL and the light emitting signal line EL are low-level signals, and both of the signals of the scan signal line GL and the reset signal line RL are high-level signals. The signal of the reset signal line Reset is a low-level signal, so that the first transistor T1 and the seventh transistor T7 are cut off. The signal of the scan signal terminal SL is a low-level signal, both of the signals of the scan signal line GL and the reset signal line RL are the high-level signals, so that the second transistor T2, the fourth transistor T4 and the eighth transistor T8 are cut off. The signal of the light emitting signal line EL is a low-level signal, so that the fifth transistor T5 and the sixth transistor T6 are turned on, and a power supply voltage output by the first power supply terminal VDD provides a drive voltage to the first electrode of the light emitting device L through the turned-on fifth transistor T5, the third transistor T3, and the sixth transistor T6 to drive the light emitting device L to emit light.

In a drive process of the pixel circuit, a drive current flowing through the third transistor T3 (drive transistor) is determined by a voltage difference between the control electrode and the first electrode of the third transistor T3. Since the voltage of the first node N1 is Vd−|Vth|, the drive current of the third transistor T3 is as follows:

$$I=K^*(Vgs-Vth)^2=K^*[(Vdd-Vd+|Vth|)-Vth]^2=K^*[(Vdd-Vd]^2$$

where I is the drive current flowing through the third transistor T3, i.e., a drive current for driving the light emitting device, K is a constant, Vgs is the voltage difference between the control electrode and the first electrode of the third transistor T3, Vth is the threshold voltage of the third transistor T3, Vd is the data voltage output by the data signal line D, and Vdd is the power voltage output by the first power supply terminal VDD.

Figure 6:
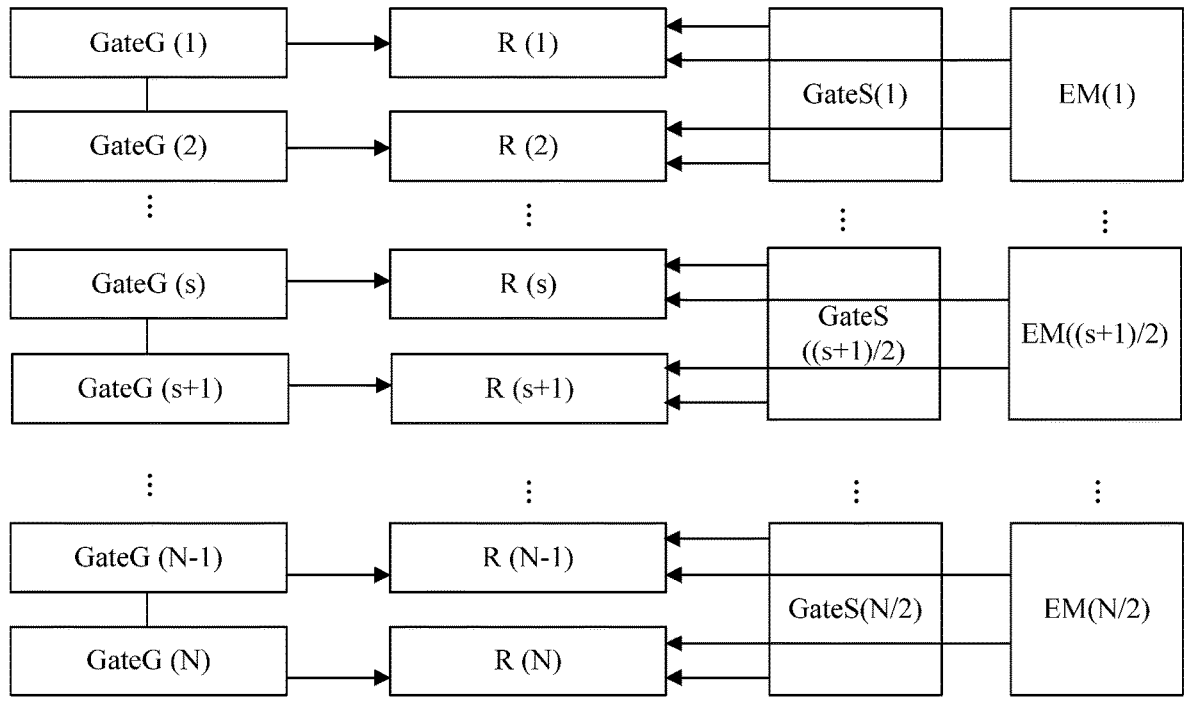
FIG. 6 is a schematic diagram illustrating a connection of multiple drive circuit according to an exemplary embodiment.

FIG. 6 is a schematic diagram illustrating a connection of multiple drive circuit according to an exemplary embodiment. R (i) in FIG. 6 refers to a pixel circuit in an i-th row.

As shown in FIG. 6, in an exemplary embodiment, a scan drive circuit includes N cascaded scan shift registers GateG (1) to GateG (N), where N is a total number of rows of the pixel circuits.

In an exemplary embodiment, a scan shift register includes an input terminal, an output terminal, a first clock signal terminal and a second clock signal terminal.

In an exemplary embodiment, a duration when a signal of the first clock signal terminal in a same scan shift register is a low-level signal is different from a duration when a signal of the second clock signal terminal is a low-level signal.

Figure 7A:
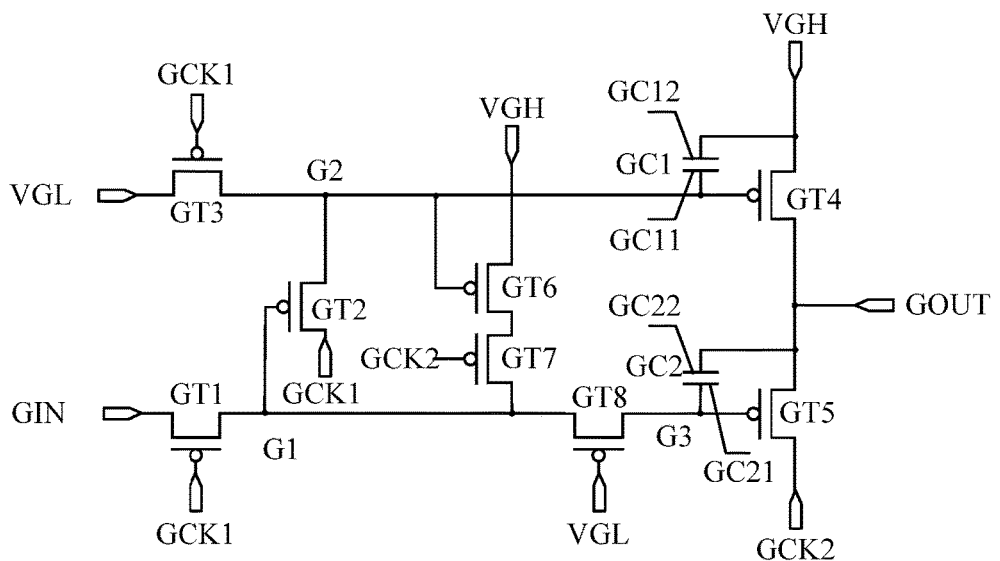
FIG. 7A is an equivalent circuit diagram of a scan shift register according to an exemplary embodiment.
Figure 7B:
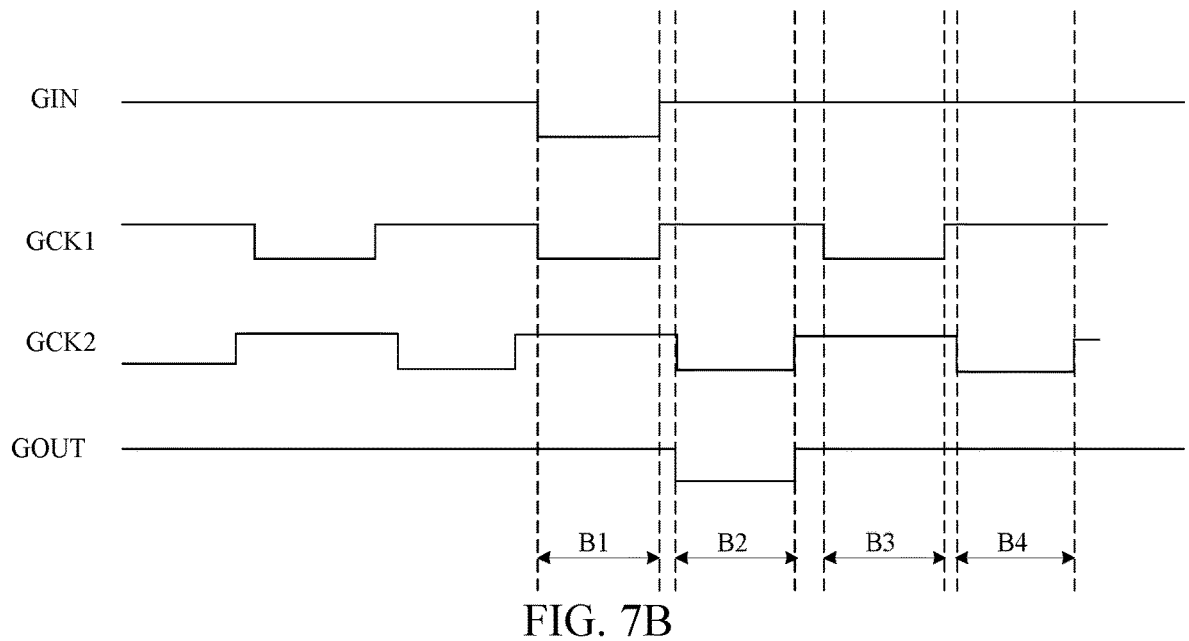
FIG. 7B is a timing diagram of the scan shift register according to FIG. 7A.

FIG. 7A is an equivalent circuit diagram of a scan shift register according to an exemplary embodiment, and FIG. 7B is a timing diagram of the scan shift register according to FIG. 7A. As shown in FIG. 7A, the scan shift register includes a first scan transistor GT1 to an eighth scan transistor GT8, a first scan capacitor GC1 and a second scan capacitor GC2.

In an exemplary embodiment, as shown in FIG. 7A, a control electrode of the first scan transistor GT1 is electrically connected with a first clock signal terminal GCK1, a first electrode of the first scan transistor GT1 is electrically connected with an input terminal GIN, and a second electrode of the first scan transistor GT1 is electrically connected with a first node G1. A control electrode of the second scan transistor GT2 is electrically connected with a first node G1, a first electrode of the second scan transistor GT2 is electrically connected with the first clock signal terminal GCK1, and a second electrode of the second scan transistor GT2 is electrically connected with a second node G2. A control electrode of the third scan transistor GT3 is electrically connected with the first clock signal terminal GCK1, a first electrode of the third scan transistor GT3 is electrically connected with a second power supply terminal VGL, and a second electrode of the third scan transistor GT3 is electrically connected with the second node G2. A control electrode of the fourth scan transistor GT4 is electrically connected with the second node G2, a first electrode of the fourth scan transistor GT4 is electrically connected with a first power supply terminal VGH, and a second electrode of the fourth scan transistor GT4 is electrically connected with an output terminal GOUT. A control electrode of the fifth scan transistor GT5 is electrically connected with a third node G3, a first electrode of the fifth scan transistor GT5 is electrically connected with a second clock signal terminal GCK2, and a second electrode of the fifth scan transistor GT5 is electrically connected with the output terminal GOUT. A control electrode of the sixth scan transistor GT6 is electrically connected with the second node G2, a first electrode of the sixth scan transistor GT6 is electrically connected with the first power supply terminal VGH, and a second electrode of the sixth scan transistor GT6 is electrically connected with a first electrode of the seventh scan transistor GT7. A control electrode of the seventh scan transistor GT7 is electrically connected with the second clock signal terminal GCK2, and a second electrode of the seventh scan transistor GT7 is electrically connected with the first node G1. A control electrode of the eighth scan transistor GT8 is electrically connected with the second power supply terminal VGL, a first electrode of the eighth scan transistor GT8 is electrically connected with the first node G1, and a second electrode of the eighth scan transistor GT8 is electrically connected with the third node G3. One end of the first scan capacitor GC1 is electrically connected with the first power supply terminal VGH, and the other end of the first scan capacitor GC1 is electrically connected with the second node G2. A first plate GC21 of the second scan capacitor GC2 is electrically connected with the third node G3, and a second plate GC22 of the second scan capacitor GC2 is electrically connected with the output terminal GOUT.

In an exemplary embodiment, the first scan transistor GT1 to the eighth scan transistor GT8 may be P-type transistors or may be N-type transistors.

In an exemplary embodiment, the first power supply terminal VGH continuously provides a high-level signal, and the second power supply terminal VGL continuously provides a low-level signal.

Taking the first scan transistor GT1 to the eighth scan transistor GT8 being P-type transistors as an example, as shown in FIG. 7B, an operating process of the scan shift register according to the exemplary embodiment includes following phases.

In an input phase B1, signals of the first clock signal terminal GCK1 and the input terminal GIN are both low-level signals, and a signal of the second clock signal terminal GCK2 is a high-level signal. As the signal at the first clock signal terminal GCK1 is a low-level signal, the first scan transistor GT1 is turned on, and the signal at the input terminal GIN is transmitted to the first node G1 through the first scan transistor GT1. As a signal of the eighth scan transistor GT8 receives a low-level signal of the second power supply terminal VGL, the eighth scan transistor GT8 is in an ON state. An electrical level at the third node G3 may control the fifth control transistor GT5 to be turned on, and the signal of the second clock signal terminal GCK2 is transmitted to an output terminal GOUT through the fifth scan transistor GT5, that is, in an input phase C1, the output terminal GOUT has a signal of the second clock signal terminal GCK2 which is a high-level signal. In addition, since the signal of the first clock signal terminal GCK1 is the low-level signal, the third control transistor GT3 is turned on, and the low-level signal of the second power supply terminal VGL is transmitted to the second node G2 through the third control transistor GT3. At this point, both the fourth scan transistor GT4 and the sixth scan transistor GT6 are turned on. As the signal of the second scan clock signal terminal GCK2 is a high-level signal, the seventh scan transistor GT7 is cut off.

In an output phase B2, the signal of the first clock signal terminal GCK1 is a high-level signal, the signal of the second clock signal terminal GCK2 is a low-level signal, and the signal of the input terminal GIN is a high-level signal. The fifth scan transistor GT5 is turned on, so that the signal of the second clock signal terminal GCK2 is used as a signal of the output terminal GOUT through the fifth scan transistor GT5. In the output phase C2, an electrical level at a terminal of the second scan capacitor GC2 connected with the output terminal GOUT becomes a signal of the second power supply terminal VGL. Due to a bootstrap effect of the second scan capacitor GC2, the eighth scan transistor GT8 is cut off, the fifth scan transistor GT5 can be turned on more effectively, and the signal of the output terminal GOUT is a low-level signal. In addition, the signal of the first clock signal terminal GCK1 is a high-level signal, so that both the first scan transistor GT1 and the third scan transistor GT3 are cut off. The second scan transistor GT2 is turned on, and the high-level signal of the first clock signal terminal GCK1 is transmitted to the second node G2 through the second scan transistor GT2, so that both the fourth scan transistor GT4 and the sixth scan transistor GT6 are cut off. As the signal of the second clock signal terminal GCK2 is a low-level signal, the seventh scan transistor GT7 is turned on.

In a third phase B3, the signal of the first clock signal terminal GCK1 is a low-level signal, and the signals of the second clock signal terminal GCK2 and the input terminal GIN are high-level signals. As the signal of the first clock signal terminal GCK1 is a low-level signal and the first scan transistor GT1 is turned on, the signal of the input terminal GIN is transmitted to the first node G1 through the first scan transistor GT1, and the second scan transistor GT2 is cut off. As the eighth scan transistor GT8 is in an ON state, the fifth scan transistor GT5 is cut off. Since the signal of the first clock signal terminal GCK1 is at a low level, the third scan transistor GT3 is turned on, both of the fourth scan transistor GT4 and the sixth scan transistor GT6 are turned on, then the high-level signal of the first power supply terminal VGH is transmitted to the output terminal GOUT through the fourth scan transistor GT4, that is, the signal of the output terminal GOUT is a high-level signal.

In a fourth phase B4, the signal of the first clock signal terminal GCK1 is a high-level signal, the signal of the second clock signal terminal GCK2 is a low-level signal, and the signal of the input terminal GIN is a high-level signal. Both the fifth scan transistor GT5 and the second scan transistor GT2 are cut off. The signal of the first clock signal terminal GCK1 is the high-level signal, so that both of the first scan transistor GT1 and the third scan transistor GT3 are cut off. Due to a holding function of the first scan capacitor GC1, both of the fourth scan transistor GT4 and the sixth scan transistor GT6 are turned on, and the high-level signal is transmitted to the output terminal GOUT through the fourth scan transistor GT4, that is, the signal of the output terminal GOUT is a high-level signal. In this phase, as the signal of the second clock signal terminal GCK2 is the low-level signal, the seventh scan transistor GT7 is turned on, so that the high-level signal is transmitted to the third node G3 and the first node G1 through the sixth scan transistor GT6 and the seventh scan transistor GT7, thus the signals of the third node G3 and the first node G1 are kept as high-level signals.

In an exemplary embodiment, the scan drive circuit further includes a scan initial signal line.

In an exemplary embodiment, as shown in FIG. 6, an output terminal of a scan shift register in an i-th stage is electrically connected with an input terminal of a scan shift register in an (i+1)-th stage and a scan signal line of a pixel circuit in the i-th row, respectively, wherein 1≤i<N.

In an exemplary embodiment, a first clock signal terminal of a scan shift register in an s-th stage is electrically connected with the second scan clock signal line, a second clock signal terminal of the scan shift register in the s-th stage is electrically connected with the first scan clock signal line, a first clock signal terminal of a scan shift register in an (s+1)-th stage is electrically connected with the first scan clock signal line, a second clock signal terminal of the scan shift register in the (s+1)-th stage is electrically connected with the second scan clock signal line, wherein 1≤s<N and s is an odd number.

In an exemplary embodiment, a duration of the first clock signal being a low-level signal in one period may be greater than a duration of the second clock signal being a low-level signal in one period.

In the present disclosure, the duration of the first clock signal being a low-level signal in one period is greater than the duration of the second clock signal being a low-level signal in one period, so that a duration when a signal from the scan drive circuit to a scan signal line of a pixel circuit in one of two adjacent rows is an effective level signal is greater than a duration when a signal from the scan drive circuit to a scan signal line of a pixel circuit in another one of the two adjacent rows is an effective level signal. For example, a duration when a signal from the scan drive circuit to a scan signal line of a pixel circuit in an odd-numbered row is the effective level signal may be greater than a duration when a signal from the scan drive circuit to a scan signal line of a pixel circuit in an even-numbered row is the effective level signal. Alternatively, the duration when the signal from the scan drive circuit to the scan signal line of the pixel circuit in the even-numbered row is the effective level signal may be greater than the duration when the signal from the scan drive circuit to the pixel circuit in the odd-numbered row is the effective level signal.

Figure 8:
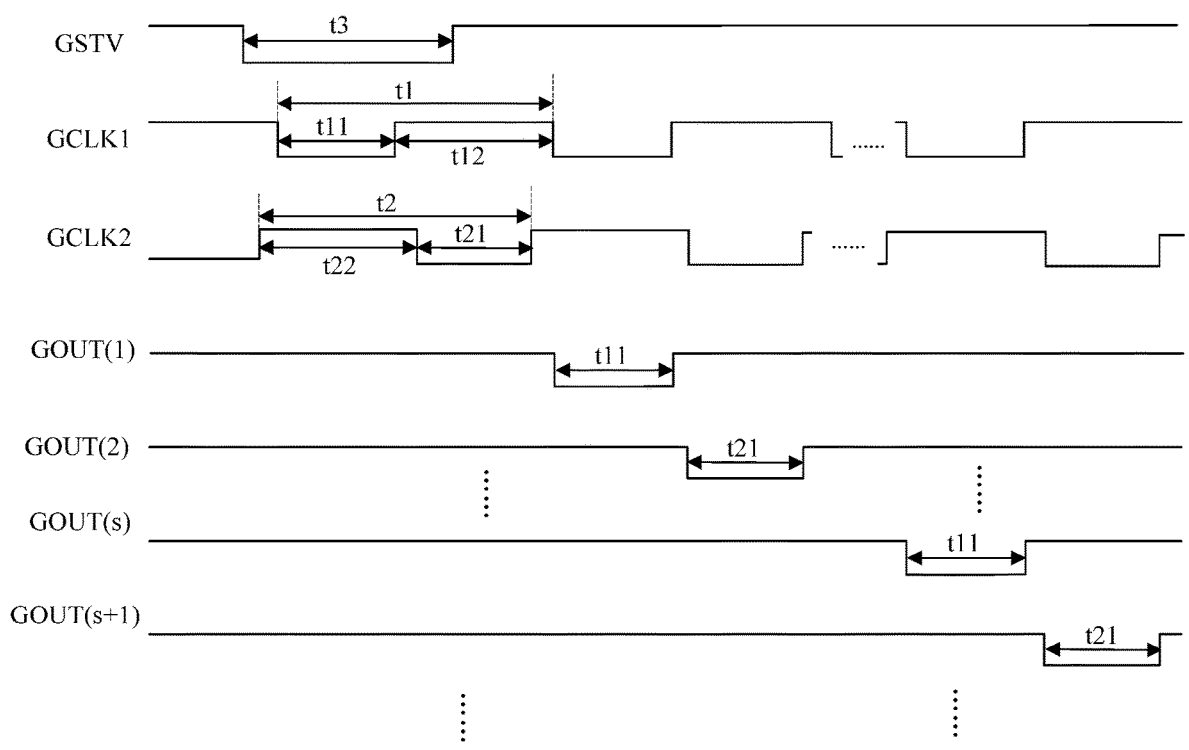
FIG. 8 is a timing diagram illustrating operation of the scan drive circuit.

FIG. 8 is a timing diagram illustrating operation of a scan drive circuit. In an exemplary embodiment, as shown in FIG. 8, when a signal of a scan initial signal line GSTV is a single pulse signal and the signal of the scan initial signal line GSTV is a low-level signal, the first clock signal is a high-level signal and the second clock signal is a low-level signal.

In an exemplary embodiment as shown in FIG. 8, a duration t3 of the signal of the scan initial signal line GSTV being a low-level signal is greater than a duration t22 of the second clock signal being a high-level signal, and is smaller than a period of the first clock signal or the second clock signal.

In an exemplary embodiment, a duration t11 of the first clock signal being a low-level signal is 30% to 35% of one period (e.g. a scanning time of one row of pixel circuits or a period of the first clock signal); and/or, a duration t21 of the second clock signal being a low-level signal is 30% to 35% of one period. In this way, the requirement of timing of the pixel circuit can be better met.

In an exemplary embodiment as shown in FIG. 8, the duration t11 of the first clock signal being a low-level signal in one period may be about 1.8 microseconds to 1.9 microseconds, and a duration t12 of the first clock signal is a high-level signal in one period may be about 3.7 microseconds to 3.8 microseconds. For example, the duration t11 of the first clock signal being a low-level signal in one period may be about 1.8 microseconds, or may be about 1.9 microseconds, and the duration t12 of the first clock signal being a high-level signal in one period may be about 3.7 microseconds, or may be about 3.8 microseconds. When the duration t11 of the first clock signal being a low-level signal in one period is 1.8 microseconds, the duration t12 of the first clock signal being a high-level signal in one period is 3.8 microseconds. When the duration t11 of the first clock signal being a low-level signal in one period is 1.9 microseconds, the duration t12 of the first clock signal being a high-level signal in one period is 3.7 microseconds. At this time, the period of the first clock signal is 5.6 microseconds. The period herein is described by taking the period of the first clock signal or the period of the second clock signal as an example.

In an exemplary embodiment, as shown in FIG. 8, the duration t12 of the second clock signal being a low-level signal in one period may be about 1.7 microseconds to 1.8 microseconds, and the duration t22 of the second clock signal being a high-level signal in one period may be about 3.8 microseconds to 3.9 microseconds. For example, the duration t11 of the second clock signal being a low-level signal in one period may be about 1.7 microseconds, or may be about 1.8 microseconds, and the duration t12 of the second clock signal being a high-level signal in one period may be about 3.8 microseconds, or may be about 3.9 microseconds. When the duration t11 of the second clock signal being a low-level signal in one period is 1.7 microseconds, the duration t12 of the second clock signal being a high-level signal in one period is 3.9 microseconds. When the duration t11 of the second clock signal being a low-level signal in one period is 1.8 microseconds, the duration t12 of the second clock signal being a high-level signal in one period is 3.8 microseconds. At this time, the period of the second clock signal is 5.6 microseconds. The period herein is described by taking the period of the first clock signal or the period of the second clock signal as an example.

In an exemplary embodiment, the duration t11 of the first clock signal being a low-level signal in one period is 1.8 microseconds, the duration t12 of the first clock signal being a high-level signal in one period is 3.8 microseconds, the duration t11 of the second clock signal being a low-level signal in one period is 1.7 microseconds, the duration t12 of the second clock signal being a high-level signal in one period is 3.9 microseconds. Alternatively, the duration t11 of the first clock signal being a low-level signal in one period is 1.9 microseconds, the duration t12 of the first clock signal being a high-level signal in one period is 3.7 microseconds, the duration t11 of the second clock signal being a low-level signal in one period is 1.8 microseconds, and the duration t12 being the second clock signal being a high-level signal in one period is 3.8 microseconds. The period herein is described by taking the period of the first clock signal or the period of the second clock signal as an example.

In an exemplary embodiment as shown in FIG. 8, a difference between the duration t11 of the first clock signal being a low-level signal and the duration t21 of the second clock signal being a low-level signal in one period (e.g. the scanning time one row of pixel circuits, or the period of the first clock signal, or the period of the second clock signal) is 0.08% to 3% of the period. This configuration can ensure input of scan signals of pixels in adjacent rows, effectively improve the brightness difference and fine cross striation phenomenon of pixels in odd-numbered and even-numbered rows, and improve the display effect of the display substrate. If the difference between the duration t11 of the first clock signal being a low-level signal and the duration t21 of the second clock signal being a low-level signal in one period is too large, the inputs of scan signals between pixel rows will be interrupted, even stopped. The difference between the duration t11 of the first clock signal being a low-level signal in one period and the duration t21 of the second clock signal being a low-level signal in one period is too small, and the brightness difference and the fine cross striation phenomenon of pixels in adjacent rows (e.g. odd and even rows) are not obviously improved.

In an exemplary embodiment, as shown in FIG. 8, the difference between the duration t11 of the first clock signal being a low-level signal in one period and the duration t21 of the second clock signal being a low-level signal in one period may be about 0.05 microseconds to 0.15 microseconds. For example, the difference between the duration t11 of the first clock signal being a low-level signal in one period and the duration t21 of the second clock signal being a low-level signal in one period may be about 0.1 microseconds, which is not limited in the present disclosure. The period herein is described by taking the period of the first clock signal or the period of the second clock signal as an example.

As shown in FIGS. 1 and 6, when the pixel circuit further includes a compensation transistor and a control signal line SL, and the control signal line SL is electrically connected with a control electrode of the compensation transistor, and the compensation transistor is of a transistor type different from the write transistor (i.e. the pixel circuit is the pixel circuit according to FIG. 4A), in an exemplary embodiment, the display substrate further includes a control drive circuit, which includes control shift registers GateS (1) to GateS (N/2) in N/2 stages, and a control shift register includes an input terminal and an output terminal. An output terminal of a control shift register in the j-th stage is electrically connected with a control signal line of a pixel circuit in the (2j−1)-th row, a control signal line of a pixel circuit in the 2j-th row and an input terminal of a control shift register in the (j+1)-th stage, respectively, wherein 1≤j<N/2.

When the pixel circuit is the pixel circuit according to FIG. 4A, the scan signal line GL is also electrically connected with a control electrode of an anode reset transistor, as shown in FIG. 1, the control drive circuit may also be electrically connected with the reset signal lines of the pixel circuits in N rows. In this case, end time of a signal of a reset signal line being an effective level signal is earlier than start time of a signal of a control signal line of a pixel circuit in a same row being an effective level signal.

In an exemplary embodiment, the difference between the end time of the signal of the reset signal line being an effective level signal and start time of the signal of the control signal line of a pixel circuit in a same row being an effective level signal is greater than a duration of the signal of the reset signal line of the pixel circuit in the same row being an effective level signal.

As shown in FIGS. 2 and 6, when the pixel circuit further includes a compensation reset transistor and a control signal line electrically connected with a control electrode of the compensation reset transistor, and the compensation reset transistor is of a transistor type different from the write transistor (i.e. the pixel circuit is the pixel circuit according to FIG. 5A), in an exemplary embodiment, the display substrate may further include a control drive circuit, which includes control shift registers GateS (1) to GateS (N/2) in N/2 stages, and a control shift register includes an input terminal and an output terminal. An output terminal of a control shift register in the j-th stage is electrically connected with a control signal line of a pixel circuit in the (2j−1)-th row, a control signal line of a pixel circuit in the 2j-th row and an input terminal of a control shift register in the (j+1)-th stage, respectively, wherein 1≤j<N/2.

In an exemplary embodiment, when the pixel circuit is the pixel circuit according to FIG. 5A, the scan signal line GL is also electrically connected a control electrode of a compensation transistor with a control electrode of the anode reset transistor. As shown in FIG. 2, the scan drive circuit is electrically connected with the reset signal lines ($RL_1$ to $RL_N$) of the pixel circuits in the N rows. In this case, end time of a signal of a reset signal line of the pixel circuit being an effective level signal is earlier than start time of a signal of a scan signal line of a pixel circuit in the same row being an effective level signal.

In an exemplary embodiment, as shown in FIGS. 1 and 2, the control drive circuit may generate a scan signal that is to be provided to scan signal lines $SL_1$, $SL_2$, $SL_3$, . . . and $SL_N$ by receiving a clock signal, a scan start signal, and the like from the timing controller. For example, the control drive circuit may sequentially provide a control signal having on-level pulses to the control signal lines $SL_1$ to $SL_N$. For example, the control drive circuit may be constructed in a form of a shift register, and may generate a control signal by sequentially transmitting a control start signal provided in a form of an on-level pulse to a next stage circuit under control of the clock signal.

The duration of the first clock signal being the low-level signal is the same as the duration of the second clock signal being the low-level signal in a reference display substrate. The duration when the signal supplied by the scan drive circuit in the reference display substrate to a scan signal line of a pixel circuit in the s-th row is the effective level signal is the same as the duration when the signal supplied by the scan drive circuit in the reference display substrate to a scan signal line of a pixel circuit in an (s+1)-th row is the effective level signal. That is, for write transistors of pixel circuits in adjacent rows, their turn-on time is the same, time for data signal writing is the same, and a first stage shift register in the control drive circuit supplies a same signal to the control signal line of pixel circuit in the s-th row and the control signal line of the pixel circuit in the (s+1)-th row. After data signals are written to pixel circuit in the s-th row and to the pixel circuit in the (s+1)-th row (that is, after charging), because of different turn-on time of write transistors of different pixel circuits and the influence of parasitic capacitance in the pixel circuits, a light emitting device driven by the pixel circuit in the s-th row shows less brightness, while a light emitting device driven by the pixel circuit in the (s+1)-th row shows greater brightness, and the (s+1)-th row acts as a bright row and the s-th row acts as a dark row, that is, the even-numbered rows act as bright rows and the odd-numbered rows act as the dark rows.

Compared with a reference display substrate, in the display substrate according to the present disclosure, the duration of the first clock signal being a low-level signal in one period is greater than the duration of the second clock signal being a low-level signal in one period, so that the duration when a signal from the scan drive circuit to a scan signal line of a pixel circuit in an odd-numbered row is the effective level signal is greater than the duration when a signal from the scan signal line to a pixel circuit in an even-numbered row is the effective level signal, even if writing time of the data signal of the pixel circuit in the odd-numbered row is greater than writing time of the data signal of the pixel circuit in the even-numbered row.

In an exemplary embodiment, for example, the difference between the duration t11 of the first clock signal being a low-level signal in one period and the duration t21 of the second clock signal being a low-level signal in one period is 0.1 microseconds, in order to achieve that the duration of the first clock signal being a low-level signal in one period is greater than the duration of the second clock signal being a low-level signal in one period, in the reference display substrate, the second clock signal in the reference display substrate is remained unchanged, a falling edge at which the first clock signal in the reference display substrate is a high-level signal can be shifted forward by 0.1 microseconds. Alternatively, a rising edge at which the first clock signal is a high-level signal can be shifted backward by 0.1 microseconds, while the rising edge at which the first clock signal is a low-level signal is shifting backward by 0.1 microseconds. Alternatively, the falling edge at which the first clock signal is a high-level signal can be shifted backward by 0.05 microseconds, while the falling edge at which the first clock signal is a low-level signal is shifted forward by 0.05 microseconds, and the rising edge at which the first clock signal is a low-level signal is shifted backward by 0.05 microseconds, which is not limited in the present disclosure, as long as the duration t11 of the first clock signal being the low-level signal in one period is greater than the duration t21 of the second clock signal being the low-level signal in one period. At that point, since writing time of a data signal of a pixel circuit in an odd-numbered row is greater than writing time of a data signal of a pixel circuit in an even-numbered row, a potential of the first node in pixel circuit in the odd-numbered row is lower with respect to a potential of the first node in the pixel circuit in the even-numbered row, so that the turn-on time of the drive transistor of the pixel circuit in the odd-numbered row is longer, brightness of the light emitting device driven by the pixel circuit in the odd-numbered row in the present disclosure is greater than brightness of the light emitting device driven by the pixel circuit in the odd-numbered row in the reference display substrate, thereby improving the brightness of the light emitting device driven by the pixel circuit in the odd-numbered row, brightening the dark rows, reducing the brightness difference between odd-numbered and even-numbered lines, and improving the fine cross striation phenomenon.

In an exemplary embodiment, for example, the difference between the duration t11 of the first clock signal being a low-level signal in one period and the duration t21 of the second clock signal being a low-level signal in one period is 0.1 microseconds, in order to achieve that the duration of the first clock signal being a low-level signal in one period is greater than the duration of the second clock signal being a low-level signal in one period, in the reference display substrate, the first clock signal in the reference display substrate is remained unchanged, a falling edge at which the first clock signal in the reference display substrate is a high-level signal can be shifted backward by 0.1 microseconds; alternatively, a rising edge at which the first clock signal is a high-level signal can be shifted forward by 0.1 microseconds, while the rising edge of the first clock signal as a low-level signal is shifting forward by 0.1 microseconds; alternatively, the falling edge at which the first clock signal is a high-level signal can be shifted forward by 0.05 microseconds, while the falling edge at which the first clock signal is a low-level signal is shifted backward by 0.05 microseconds, and the rising edge at which the first clock signal is a low-level signal is shifted forward by 0.05 microseconds, which is not limited in the present disclosure, as long as the duration t11 of the first clock signal being the low-level signal in one period is greater than the duration t21 of the second clock signal being the low-level signal in one period. At that point, since writing time of a data signal of a pixel circuit in an odd-numbered row is greater than writing time of a data signal of a pixel circuit in an even-numbered row, a potential of the first node in pixel circuit in the even-numbered row is higher with respect to the potential of the first node in the pixel circuit in the odd-numbered row, so that turn-on time of the drive transistor of the pixel circuit in the even-numbered row is shorter, brightness of the light emitting device driven by the pixel circuit in the even-numbered row in the present disclosure is smaller than brightness of the light emitting device driven by the pixel circuit in the even-numbered row in the reference display substrate, thereby reducing the brightness of the light emitting device driven by the pixel circuit in the even-numbered row, darkening the bright rows, reducing the brightness difference between odd-numbered and even-numbered roes, and improving the fine cross striation phenomenon.

In an exemplary embodiment, the first clock signal and the second clock signal may ensure integrity of the data signal written.

As shown in FIGS. 1, 2, and 6, in an exemplary embodiment, the display substrate may further include a light emitting drive circuit, and the pixel circuit may further include a light emitting transistor and a light emitting signal line electrically connected with a control electrode of the light emitting transistor, the light emitting transistor is of a same transistor type as the write transistor. The light emitting drive circuit includes light emitting shift registers in N/2 stages (EM (1) to EM (N/2)), wherein a light emitting shift register includes an input terminal and an output terminal, and an output terminal of a light emitting shift register in the j-th stage is electrically connected with a light emitting signal line of a pixel circuit in the (2j−1)-th row, a light emitting signal line of a pixel circuit in the 2j-th row and an input terminal of a light emitting shift register in the (j+1)-th stage respectively, wherein $1 \leq j < N/2$.

In an exemplary embodiment, as shown in FIGS. 1 and 2, the light emitting drive circuit may receive the clock signal, the light emitting stop signal, etc., from the timing controller to generate a light emitting signal that is to be provided to the light emitting signal lines $EL_1$, $EL_2$, $EL_3$, . . . , and $EL_N$. For example, the light emitting drive circuit may sequentially provide an emission signal with an off-level pulse to the light emitting signal lines $EL_1$ to $EL_N$. For example, the light emitting drive circuit may be constructed in a form of a shift register and may generate a light emitting signal by sequentially transmitting a light emitting stop signal according to a form of an off-level pulse to a next stage circuit under control of the clock signal.

In an exemplary embodiment, the control shift register includes multiple control transistors and multiple control capacitors, and a circuit structure of the control shift register may be 13T3C, which is not limited in the present disclosure.

Figure 9A:
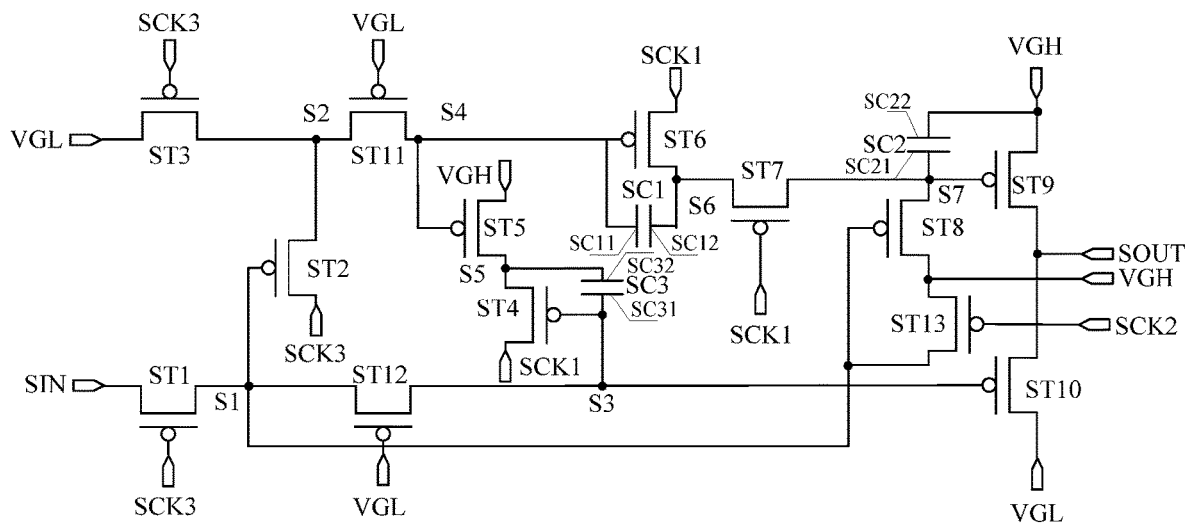
FIG. 9A is an equivalent circuit diagram of a control shift register according to an exemplary embodiment.
Figure 9B:
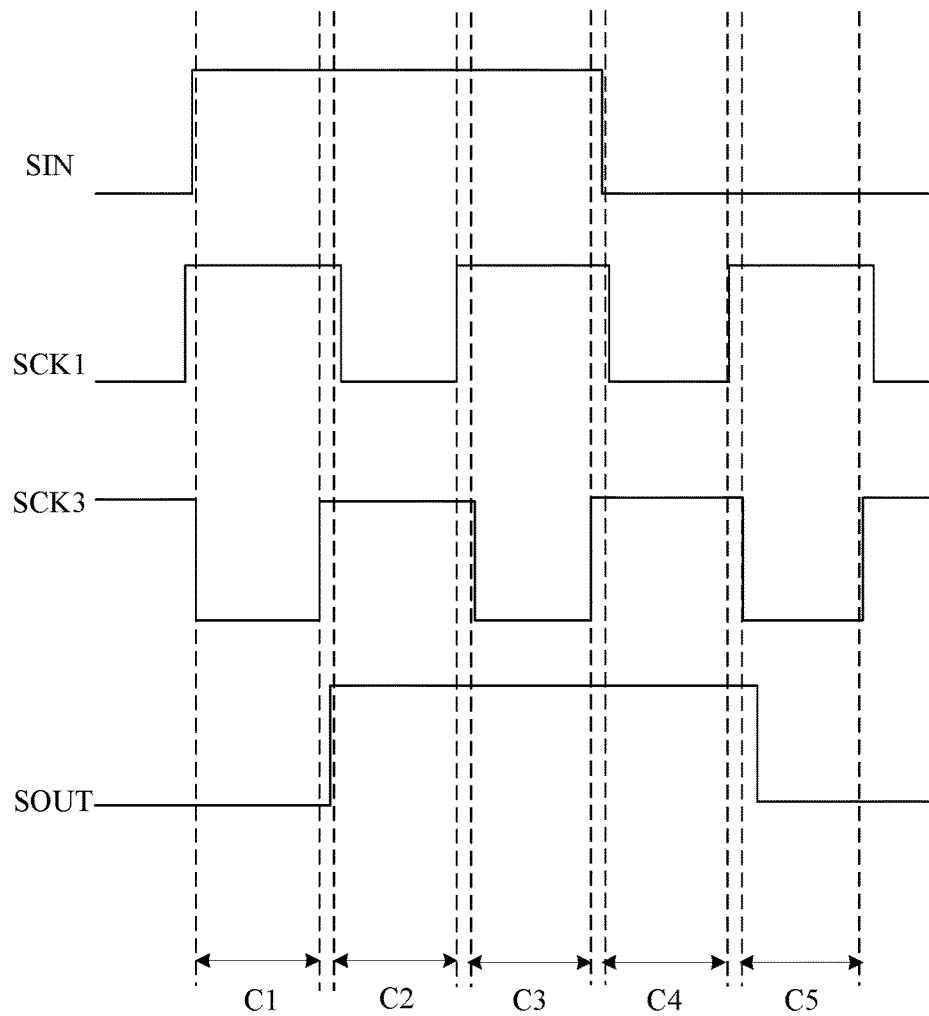
FIG. 9B is a timing diagram of the control shift register according to FIG. 9A.

FIG. 9A is an equivalent circuit diagram of a control shift register according to an exemplary embodiment, and FIG. 9B is a timing diagram of the control shift register according to FIG. 9A. As shown in FIG. 9A, the control shift register includes a first control transistor ST1 to a thirteenth control transistor ST13, and a first control capacitor SC1 to a third control capacitor SC3.

In an exemplary embodiment, a control electrode of the first control transistor ST1 is electrically connected with a third clock signal terminal SCK3, a first electrode of the first control transistor ST1 is electrically connected with an input terminal SIN, and a second electrode of the first control transistor ST1 is electrically connected with the first node S1. A control electrode of the second control transistor ST2 is electrically connected with the first node S1, a first electrode of the second control transistor ST2 is electrically connected with the third clock signal terminal SCK3, and a second electrode of the second control transistor ST2 is electrically connected with a second node S2. A control electrode of the third control transistor ST3 is electrically connected with the third clock signal terminal SCK3, a first electrode of the third control transistor ST3 is electrically connected with a second power supply terminal VGL, and a second electrode of the third control transistor ST3 is electrically connected with the second node S2. A control electrode of the fourth control transistor ST4 is electrically connected with a third node S3, a first electrode of the fourth control transistor ST4 is electrically connected with a first clock signal terminal SCK1, and a second electrode of the fourth control transistor ST4 is electrically connected with a fifth node S5. A control electrode of the fifth control transistor ST5 is electrically connected with a fourth node S4, a first electrode of the fifth control transistor ST5 is electrically connected with the fifth node S5, and a second electrode of the fifth control transistor ST5 is electrically connected with a first power supply terminal VGH. A control electrode of the sixth control transistor ST6 is electrically connected with the fourth node S4, a first electrode of the sixth control transistor ST6 is electrically connected with the first clock signal terminal SCK1, and a second electrode of the sixth control transistor ST6 is electrically connected with a sixth node S6. A control electrode of the seventh control transistor ST7 is electrically connected with the first clock signal terminal SCK1, a first electrode of the seventh control transistor ST7 is electrically connected with the sixth node S6, and a second electrode of the seventh control transistor ST7 is electrically connected with a seventh node S7. A control electrode of the eighth control transistor ST8 is electrically connected with the first node S1, a first electrode of the eighth control transistor ST8 is electrically connected with the first power supply terminal VGH, and a second electrode of the eighth control transistor ST8 is electrically connected with the seventh node S7. A control electrode of the ninth control transistor ST9 is electrically connected with the seventh node S7, a first electrode of the ninth control transistor ST9 is electrically connected with the first power supply terminal VGH, and a second electrode of the ninth control transistor ST9 is electrically connected with an output terminal SOUT. A control electrode of the tenth control transistor ST10 is electrically connected with the third node S3, a first electrode of the tenth control transistor ST10 is electrically connected with the second power supply terminal VGL, and a second electrode of the tenth control transistor ST10 is electrically connected with the output terminal SOUT. A control electrode of the eleventh control transistor ST11 is electrically connected with the second power supply terminal VGL, a first electrode of the eleventh control transistor ST11 is electrically connected with the second node S2, and a second electrode of the eleventh control transistor ST11 is electrically connected with the fourth node S4. A control electrode of the twelfth control transistor ST12 is electrically connected with the second power supply terminal VGL, a first electrode of the twelfth control transistor ST12 is electrically connected with the first node S1, and a second electrode of the twelfth control transistor ST12 is electrically connected with the third node S3. A control electrode of the thirteenth control transistor ST13 is electrically connected with a second clock signal terminal SCK2, a first electrode of the thirteenth control transistor ST13 is electrically connected with the first node S1, and a second electrode of the thirteenth control transistor ST13 is electrically connected with the first power supply terminal VGH. A first plate SC11 of the first control capacitor SC1 is electrically connected with the fourth node S4, and a second plate SC12 of the first control capacitor SC1 is electrically connected with the sixth node S6. A first plate SC21 of the second control capacitor SC2 is electrically connected with the seventh node S7, and a second plate SC22 of the second control capacitor SC2 is electrically connected with the first power supply terminal VGH. A first plate SC31 of the third control capacitor SC3 is connected with the third node S3, and a second plate SC32 of the third control capacitor SC3 is connected with the fifth node S5.

In an exemplary embodiment, the first control transistor ST1 to the thirteenth control transistor ST13 may be P-type transistors or may be N-type transistors. The tenth control transistor ST10 is an output transistor.

In an exemplary embodiment, the first power supply terminal VGH continuously provides a high-level signal, and the second power supply terminal VGL continuously provides a low-level signal. Since the second power supply terminal VGL continuously provides the low-level signal, the eleventh control transistor ST11 and the twelfth control transistor ST12 are continuously turned on.

In an exemplary embodiment, the second clock signal terminal SCK2 is a low-level signal during a startup initialization stage, which prevents a ninth control transistor ST9 and a tenth control transistor ST10 of a control shift register in the last stage from simultaneously being turned on because of delay of an output signal, or is a low-level signal during an abnormal shutdown stage, which prevents the ninth control transistor ST9 and the tenth control transistor ST10 from simultaneously being turned on. The second clock signal terminal SCK2 continuously provides a high-level signal during a normal display stage, i.e. the thirteenth control transistor ST13 is continuously cut off during the normal display stage.

Taking the first control transistor ST1 to the thirteenth control transistor ST13 being P-type transistors as an example, as shown in FIG. 9B, an operating process of a control shift register according to an exemplary embodiment includes following stages.

In a first stage C1, a signal of the first clock signal terminal SCK1 is a high-level signal, and a signal of the third clock signal terminal SCK3 is a low-level signal. The signal of the third clock signal terminal SCK3 is the low-level signal, so that the first control transistor ST1, the third control transistor ST3, and the twelfth control transistor ST12 are turned on, the turned-on first light emitting transistor ST1 transmits a high-level signal of the input terminal SIN to the first node S1, thus, a level of the first node S1 becomes a high level, the turned-on twelfth control transistor ST12 transmits the high-level signal of the first node S1 to the third node S2, and the second control transistor ST2, the fourth control transistor ST4, the eighth control transistor ST8, and the tenth control transistor ST10 are cut off. In addition, the turned-on third control transistor ST3 transmits a low-level signal of the second power supply terminal VGL to the second node S2, so that a level of the second node S2 becomes a low level, the turned-on eleventh control transistor ST11 transmits a low-level signal of the second node S2 to the fourth node S4, then a level of the fourth node S4 becomes a low level, and the fifth control transistor ST5 and the sixth control transistor ST6 are turned on. Since the signal of the first clock signal terminal SCK1 is the high-level signal, the seventh control transistor ST7 is cut off. In addition, the ninth control transistor ST9 is cut off under an action of the third control capacitor SC3. In the first phase P1, since both the ninth control transistor ST9 and the tenth control transistor ST10 are cut off, a signal of the output terminal SOUT is maintained at a previous low level.

In a second stage C2, the signal of the first clock signal terminal SCK1 is a low-level signal, and the signal of the third clock signal terminal SCK3 is a high-level signal. The signal of the first clock signal terminal SCK1 is the low-level signal, so that the seventh control transistor ST7 is turned on. The signal of the third clock signal terminal SCK3 is the high-level signal, so that the first control transistor ST1 and the third control transistor ST3 are cut off. Under the action of the third control capacitor SC3, the high-level signal in a previous stage may be continuously maintained at the first node S1 and the third node S3. Due to the first control capacitor SC1, the low level in the previous stage may be continuously maintained at the fourth node S4, so that the fifth control transistor ST5 and the sixth control transistor ST6 are turned on. The second control transistor ST2, the fourth control transistor ST4, the eighth control transistor ST8, and the tenth control transistor ST10 are cut off. In addition, the low-level signal of the first clock signal terminal SCK1 is transmitted to the seventh node S7 through the turned-on sixth control transistor ST6 and the seventh control transistor ST7, the ninth control transistor ST9 is turned on and the turned-on ninth control transistor ST9 outputs a high-level signal of the first power supply terminal VGH, so the signal of the output terminal SOUT is a high-level signal.

In a third stage C3, the signal of the third clock signal terminal SCK3 is a low-level signal, and the signal of the first clock signal terminal SCK1 is a high-level signal. The signal of the first clock signal terminal SCK1 is the high-level signal, so that the seventh control transistor ST7 is cut off, and the second control transistor ST2, the fourth control transistor ST2, the eighth control transistor ST8, and the tenth control transistor ST10 are cut off. The signal of the third clock signal terminal SCK3 is the low-level signal, so that the first control transistor ST1 and the third control transistor ST3 are turned on. Under the action of the third control capacitor SC3, the ninth control transistor ST9 is kept in a turned-on state, and the turned-on ninth control transistor ST9 outputs the high-level signal of the first power supply terminal VGH, so the signal of the output terminal SOUT is still a high-level signal.

In a fourth stage C4, the signal of the first clock signal terminal SCK1 is a low-level signal, and the signal of the third clock signal terminal SCK3 is a high-level signal. The signal of the third clock signal terminal SCK3 is the high-level signal, so that the first control transistor ST1 and the third control transistor ST3 are cut off. The signal of the first clock signal terminal SCK1 is the low level, so that the seventh control transistor ST7 is turned on. Due to a storage effect of the third control capacitor SC3, levels of the first node S1 and the third node S3 are kept at high-levels in the previous stage, so that the control transistor ST2, the fourth control transistor ST4, the eighth control transistor ST8 and the tenth control transistor ST10 are cut off. Due to a storage effect of the first control capacitor SC1, the fourth node S4 is continuously kept at the low level in the previous stage, so that the fifth control transistor ST5 and the sixth control transistor ST6 are turned on. In addition, the low-level signal of the first clock signal terminal SCK1 is transmitted to the seventh node S7 through the turned-on sixth control transistor ST6 and the seventh control transistor ST7, the turned-on ninth control transistor ST9 outputs the high-level signal of the first power supply terminal VGH, so the signal of the output terminal SOUT is still a high-level signal.

In a fifth stage C5, the signal of the first clock signal terminal SCK1 is a high-level signal, and the signal of the third clock signal terminal SCK3 is a low-level signal. The signal of the third clock signal terminal SCK3 is the low-level signal, so that the first control transistor ST1 and the third control transistor ST3 are turned on. The signal of the first clock signal terminal SCK1 is the high-level signal, so that the seventh control transistor ST7 is cut off. The turned-on first control transistor ST1 transmits a low-level signal of the input terminal SIN to the first node S1, so that a level of the first node S1 turns to be a low level. The turned-on twelfth control transistor ST12 transmits a low-level signal of the first node S1 to the third node S3, so that a level of the third node S3 turns to be a low level, and the second control transistor ST2, the fourth control transistor ST4, the eighth control transistor ST8 and the tenth control transistor ST10 are turned on. The turned-on second control transistor ST2 transmits the signal of the third clock signal terminal SCK3 with a low level to the second node S2, so that the level of the second node S2 may be further pulled down, the low levels in the previous stage are continuously maintained at the second node S2 and the fourth node S4, so that the fifth control transistor ST5 and the sixth control transistor ST6 are turned on. The signal of the first clock signal terminal SCK1 is the high-level signal, so that the seventh control transistor ST7 is cut off. In addition, the turned-on eighth control transistor ST8 transmits the high-level signal of the first power supply terminal VGH to the seventh node S7, and the ninth control transistor ST9 is cut off. The turned-on tenth control transistor ST10 outputs the low-level signal of the second power supply terminal VGL, so that the signal of the output terminal SOUT turns to be at a low level.

In an exemplary embodiment, the control drive circuit includes a control initial signal line, a first control clock signal line, a second control clock signal line and a third control clock signal line.

In an exemplary embodiment, an input terminal of a control shift register in the first stage is electrically connected with the control initial signal line, and an output of a control shift register in the j-th stage is electrically connected with an input terminal of a control shift register in the (j+1)-th stage. A control shift register in the t-th stage has a first clock signal terminal electrically connected with the first control clock signal line, a second clock signal terminal electrically connected with the second control clock signal line, and a third clock signal terminal electrically connected with the third control clock signal line. A control shift register in the (t+1)-th stage has a first clock signal terminal electrically connected with the third control clock signal line, a second clock signal terminal electrically connected with the second control clock signal line, a third clock signal terminal electrically connected with the first control clock signal line, wherein 1≤t<N/2, and t is an odd number.

In an exemplary embodiment, durations when the clock signals of the first control clock signal line, the second control clock signal line, and the third control clock signal line are low-level signals may be the same or different in one period, which is not limited in the present disclosure.

In an exemplary embodiment, the light emitting shift register may include multiple light emitting transistors and multiple light emitting capacitors. A circuit structure of the light emitting shift register may be 13T3C or 10T3C, which is not limited in the present disclosure.

Figure 10A:
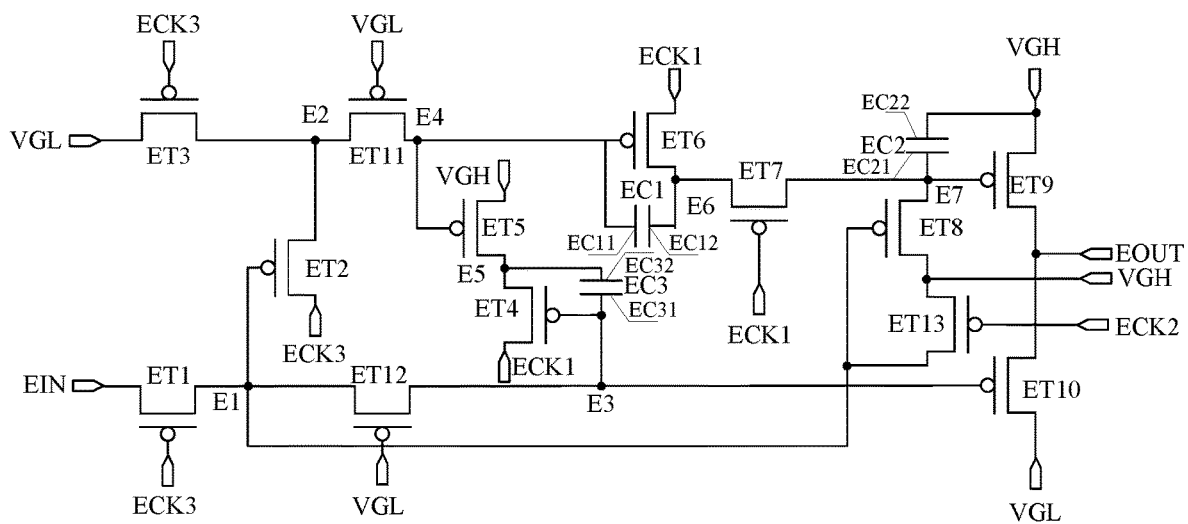
FIG. 10A is an equivalent circuit diagram of a light emitting shift register according to an exemplary embodiment.
Figure 10B:
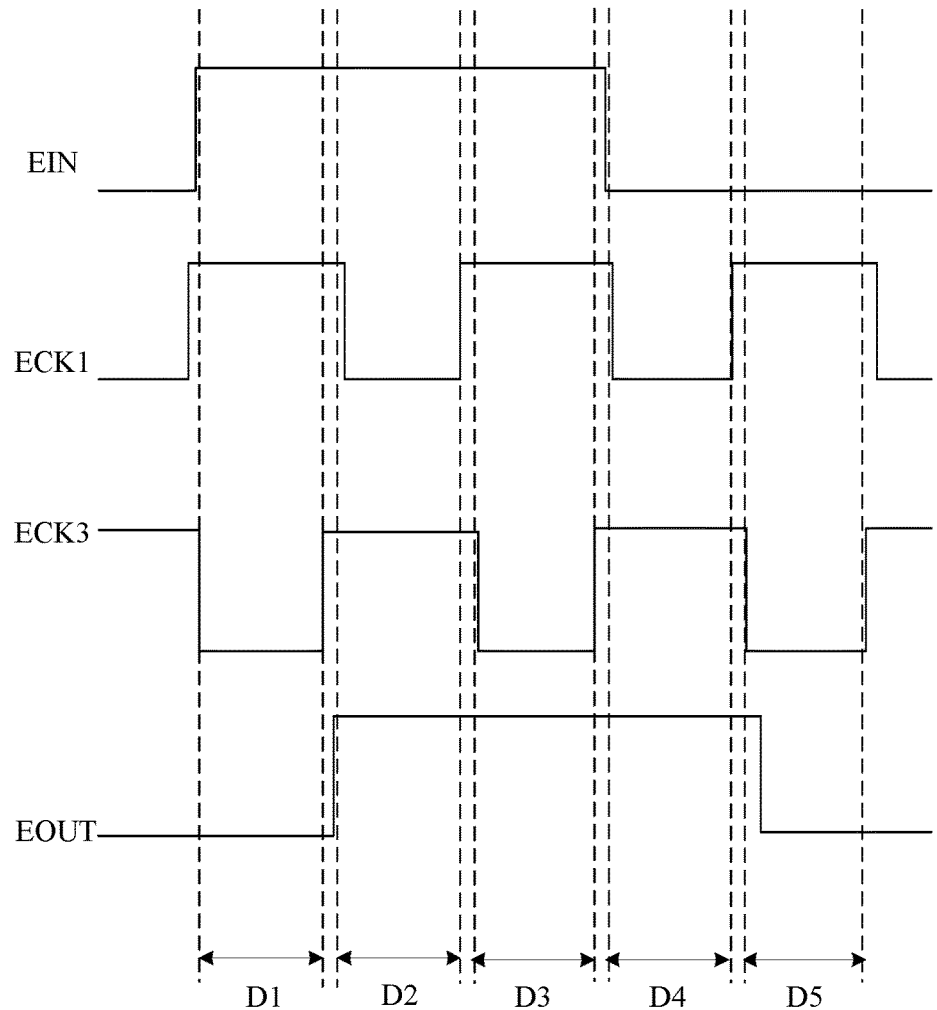
FIG. 10B is a timing diagram of a light emitting shift register according to FIG. 10A.

FIG. 10A is an equivalent circuit diagram of a light emitting shift register according to an exemplary embodiment, and FIG. 10B is a timing diagram of the light emitting shift register according to FIG. 10A. As shown in FIG. 10A, in an exemplary embodiment, the light emitting shift register may include a first light emitting transistor ET1 to a thirteenth light emitting transistor ET13 and a first light emitting capacitor EC1 to a third light emitting capacitor EC3.

In an exemplary embodiment, a control electrode of the first light emitting transistor ET1 is electrically connected with a third clock signal terminal ECK3, a first electrode of the first light emitting transistor ET1 is electrically connected with an input terminal EIN, and a second electrode of the first light emitting transistor ET1 is electrically connected with a first node E1. A control electrode of the second light emitting transistor ET2 is electrically connected with the first node E1, a first electrode of the second light emitting transistor ET2 is electrically connected with the third clock signal line ECK3, and a second electrode of the second light emitting transistor ET2 is electrically connected with a second node E2. A control electrode of the third light emitting transistor ET3 is electrically connected with the third clock signal line ECK3, a first electrode of the third light emitting transistor ET3 is electrically connected with a second power supply terminal VGL, and a second electrode of the third light emitting transistor ET3 is electrically connected with the second node E2. A control electrode of the fourth light emitting transistor ET4 is electrically connected with a third node E3, a first electrode of the fourth light emitting transistor ET4 is electrically connected with a first clock signal terminal ECK1, and a second electrode of the fourth light emitting transistor ET4 is electrically connected with a fifth node E5. A control electrode of the fifth light emitting transistor ET5 is electrically connected with a fourth node E4, a first electrode of the fifth light emitting transistor ET5 is electrically connected with the fifth node E5, and a second electrode of the fifth light emitting transistor ET5 is electrically connected with a first power supply terminal VGH. A control electrode of the sixth light emitting transistor ET6 is electrically connected with the fourth node E4, a first electrode of the sixth light emitting transistor ET6 is electrically connected with the first clock signal terminal ECK1, and a second electrode of the sixth light emitting transistor ET6 is electrically connected with a sixth node E6. A control electrode of the seventh light emitting transistor ET7 is electrically connected with the first clock signal terminal ECK1, a first electrode of the seventh light emitting transistor ET7 is electrically connected with the sixth node E6, and a second electrode of the seventh light emitting transistor ET7 is electrically connected with a seventh node E7. A control electrode of the eighth light emitting transistor ET8 is electrically connected with the first node E1, a first electrode of the eighth light emitting transistor ET8 is electrically connected with the first power supply terminal VGH, and a second electrode of the eighth light emitting transistor ET8 is electrically connected with the seventh node E7. A control electrode of the ninth light emitting transistor ET9 is electrically connected with the seventh node E7, a first electrode of the ninth light emitting transistor ET9 is electrically connected with the first power supply terminal VGH, and a second electrode of the ninth light emitting transistor ET9 is electrically connected with an output terminal EOUT. A control electrode of the tenth light emitting transistor ET10 is electrically connected with the third node E3, a first electrode of the tenth light emitting transistor ET10 is electrically connected with the second power supply terminal VGL, and a second electrode of the tenth light emitting transistor ET10 is electrically connected with the output terminal EOUT. A control electrode of the eleventh light emitting transistor ET11 is electrically connected with the second power supply terminal VGL, a first electrode of the eleventh light emitting transistor ET11 is electrically connected with the second node E2, and a second electrode of the eleventh light emitting transistor ET11 is electrically connected with the fourth node E4. A control electrode of the twelfth light emitting transistor ET12 is electrically connected with the second power supply terminal VGL, a first electrode of the twelfth light emitting transistor ET12 is electrically connected with the first node E1, and a second electrode of the twelfth light emitting transistor ET12 is electrically connected with the third node E3. A control electrode of the thirteenth light emitting transistor ET13 is electrically connected with a second clock signal terminal ECK2, a first electrode of the thirteenth light emitting transistor ET13 is electrically connected with the first node E1, and a second electrode of the thirteenth light emitting transistor ET13 is electrically connected with the first power supply terminal VGH. A first plate EC11 of the first light emitting capacitor EC1 is electrically connected with the fourth node E4, and a second plate EC12 of the first light emitting capacitor EC1 is electrically connected with the sixth node E6. A first plate EC21 of the second light emitting capacitor EC2 is connected with the seventh node E7, and a second plate EC22 of the second light emitting capacitor EC2 is connected with the first power supply terminal VGH. A first plate EC31 of the third light emitting capacitor EC3 is connected with the third node E3, and a second plate EC32 of the third light emitting capacitor EC3 is connected with the fifth node E5.

In an exemplary embodiment, the first light emitting transistor ET1 to the thirteenth light emitting transistor ET13 may be P-type transistors or may be N-type transistors.

In an exemplary embodiment, the first power supply terminal VGH continuously provides a high-level signal, and the second power supply terminal VGL continuously provides a low-level signal. Since the second power supply terminal VGL continuously provides the low-level signal, the eleventh light emitting transistor ET11 and the twelfth light emitting transistor ET12 are continuously turned on.

In an exemplary embodiment, a signal of the second clock signal terminal ECK2 is a low-level signal during a startup initialization stage, which prevents a ninth light emitting transistor ET9 and a tenth light emitting transistor ET10 of a last light emitting shift register from being simultaneously turned on because of delay of an output signal, or is a low-level signal during an abnormal shutdown stage, which prevents the ninth light emitting transistor ET9 and the tenth light emitting transistor ET10 from simultaneously being turned on. The second clock signal terminal ECK2 continuously provides a high-level signal during a normal display stage, i.e. the thirteenth light emitting transistor ET13 is continuously cut off during the normal display stage.

Taking the first light emitting transistor ET1 to the thirteenth light emitting transistor ET13 being P-type transistors as an example, as shown in FIG. 10B, an operating process of a light emitting shift register according to an exemplary embodiment includes following stages.

In a first stage D1, a signal of the first clock signal terminal ECK1 is a high-level signal, and a signal of the third clock signal terminal ECK3 is a low-level signal. The signal of the third clock signal terminal ECK3 is the low-level signal, so that the first light emitting transistor ET1, the third light emitting transistor ET3, and the twelfth light emitting transistor ET12 are turned on, the turned-on first light emitting transistor ET1 transmits a high-level signal of the input terminal EIN to the first node E1, thus, a level of the first node E1 becomes a high level, the turned-on twelfth light emitting transistor ET12 transmits the high-level signal of the first node E1 to the third node E2, and the second light emitting transistor ET2, the fourth light emitting transistor ET4, the eighth light emitting transistor ET8, and the tenth light emitting transistor ET10 are cut off. In addition, the turned-on third light emitting transistor ET3 transmits a low-level signal of the third power supply terminal VGL to the second node E2, thus, a level of the second node E2 becomes a low level, the turned-on eleventh light emitting transistor ET11 transmits a low-level signal of the second node E2 to the fourth node E4, so that a level of the fourth node E4 becomes a low level, and the fifth light emitting transistor ET5 and the sixth light emitting transistor ET6 are turned on. The signal of the first clock signal terminal ECK1 is the high-level signal, so that the seventh light emitting transistor ET7 is cut off. In addition, the ninth light emitting transistor ET9 is cut off under an action of the third light emitting capacitor EC3. In a first stage P1, since both the ninth light emitting transistor ET9 and the tenth light emitting transistor ET10 are cut off, a signal of the output terminal EOUT is kept at a previous low level.

In a second stage D2, the signal of the first clock signal terminal ECK1 is a low-level signal, and the signal of the third clock signal terminal ECK3 is a high-level signal. The signal of the first clock signal terminal ECK1 is the low-level signal, so that the seventh light emitting transistor ET7 is turned on. The signal of the third clock signal terminal ECK3 is the high-level signal, and the first light emitting transistor ET1 and the third light emitting transistor ET3 are cut off. Under an action of the third light emitting capacitor EC3, the first node E1 and the third node E3 may continue to maintain the high-level signal of the previous stage, and under an action of the first light emitting capacitor EC1, the fourth node E4 may continue to maintain the low level of the previous stage, so the fifth light emitting transistor ET5 and the sixth light emitting transistor ET6 are turned on. The second light emitting transistor ET2, the fourth light emitting transistor ET4, the eighth light emitting transistor ET8, and the tenth light emitting transistor ET10 are cut off. In addition, the low-level signal of the first clock signal terminal ECK1 is transmitted to a seventh node E7 through the turned-on sixth light emitting transistor ET6 and the seventh light emitting transistor ET7, the ninth light emitting transistor ET9 is turned on and the turned-on ninth light emitting transistor ET9 outputs a high-level signal of a first power supply terminal VGH, so the signal of the output terminal EOUT is a high-level signal. In addition, in a third stage D3, the signal of the third clock signal terminal ECK3 is a low-level signal, and the signal of the first clock signal terminal ECK1 is a high-level signal. The signal of the first clock signal terminal ECK1 is the high-level signal, so that the seventh light emitting transistor ET7 is cut off. The second light emitting transistor ET2, the fourth light emitting transistor ET4, the eighth light emitting transistor ET8, and the tenth light emitting transistor ET10 are cut off. The signal of the third clock signal terminal ECK3 is the low-level signal, so that the first light emitting transistor ET1 and the third light emitting transistor ET3 are turned on. Under an action of the second light emitting capacitor EC3, the ninth light emitting transistor ET9 is kept in a turned-on state, and the turned-on ninth light emitting transistor ET9 outputs the high-level signal of the first power supply terminal VGH, so the signal of the output terminal EOUT is still a high-level signal.

In a fourth stage D4, the signal of the first clock signal terminal ECK1 is a low-level signal, and the signal of the third clock signal terminal ECK3 is a high-level signal. The signal of the third clock signal terminal ECK3 is the high-level signal, and the first light emitting transistor ET1 and the third light emitting transistor ET3 are cut off. The signal of the first clock signal terminal ECK1 is the low level, so that the seventh light emitting transistor ET7 is turned on. Due to a storage effect of the third light emitting capacitor EC3, levels of the first node E1 and the third node E3 are kept at high-levels of the previous stage, so that the second light emitting transistor ET2, the fourth light emitting transistor ET4, the eighth light emitting transistor ET8, and the tenth light emitting transistor ET10 are cut off. Due to a storage effect of the first light emitting capacitor EC1, the fourth node E4 continues to maintain the low level of the previous stage, so that the fifth light emitting transistor ET5 and the sixth light emitting transistor ET6 are turned on. In addition, the low-level signal of the first clock signal terminal ECK1 is transmitted to the seventh node E7 through the turned-on sixth light emitting transistor ET6 and the seventh light emitting transistor ET7, the turned-on ninth light emitting transistor ET9 outputs a high-level signal of the first power supply terminal VGH, so the signal of the output terminal EOUT is still a high-level signal.

In a fifth stage D5, the signal of the first clock signal terminal ECK1 is a high-level signal, and the signal of the third clock signal terminal ECK3 is a low-level signal. The signal of the third clock signal terminal ECK3 is the low-level signal, and the first light emitting transistor ET1 and the third light emitting transistor ET3 are turned on. The signal of the first clock signal terminal ECK1 is the high-level signal, so that the seventh light emitting transistor ET7 is cut off. The turned-on first light emitting transistor ET1 transmits a low-level signal of the input terminal EIN to the first node E1, thus, a level of the first node E1 becomes a low level, the turned-on twelfth light emitting transistor ET12 transmits a low-level signal of the first node E1 to the third node E3, so that a level of the third node E3 becomes a low level, and the second light emitting transistor ET2, the fourth light emitting transistor ET4, the eighth light emitting transistor ET8, and the tenth light emitting transistor ET10 are turned on. The turned-on second light emitting transistor ET2 transmits the low-level signal of the third clock signal terminal ECK3 to the second node E2, so that a level of the second node E2 may be further pulled down and the second node E2 and the fourth node E4 continue to maintain the low levels of the previous stage, and thus the fifth light emitting transistor ET5 and the sixth light emitting transistor ET6 are turned on. The signal of the first clock signal terminal ECK1 is the high-level signal, so that the seventh light emitting transistor ET7 is cut off. In addition, the turned-on eighth light emitting transistor ET8 transmits the high-level signal of the first power supply terminal VGH to the seventh node E7, and the ninth light emitting transistor ET9 is cut off. The turned-on tenth light emitting transistor ET10 outputs the low-level signal of the second power supply terminal VGL, so the signal of the output terminal EOUT turns to be at a low level.

In an exemplary embodiment, the light emitting drive circuit includes a light emitting initial signal line, a first light emitting clock signal line, a second light emitting clock signal line, and a third light emitting clock signal line.

In an exemplary embodiment, an input terminal of a light emitting shift register in the first stage is electrically connected with the light emitting initial signal line, and an output terminal of a light emitting shift register in the j-th stage is electrically connected with an input terminal of the light emitting shift register in the (j+1)-th stage. The light emitting shift register in the t-th stage has a first clock signal terminal electrically connected with the first control clock signal line, a second clock signal terminal electrically connected with the second light emitting clock signal line, and a third clock signal terminal electrically connected with the third light emitting clock signal line. A light emitting shift register in the (t+1)-th stage has a first clock signal terminal electrically connected with the third light emitting clock signal line, a second clock signal terminal electrically connected with the second light emitting clock signal line, and a third clock signal terminal electrically connected with the first light emitting clock signal line.

In an exemplary embodiment, durations when the clock signals of the first light emitting clock signal line, the second light emitting clock signal line, and the third light emitting clock signal line are low-level signals may be the same or different in one period, which is not limited in the present disclosure.

An embodiment of the present disclosure further provides a display device including a display substrate.

In an exemplary embodiment, the display device may be any product or component with any display function, such as a display, a television, a mobile phone, a tablet computer, a navigator, a digital photo frame and a wearable display product.

The display substrate is the display substrate according to any of the aforementioned embodiments, and has similar implementation principles and implementation effects, which will not be repeated here.

The accompanying drawings of the present disclosure only involve structures involved in the embodiments of the present disclosure, and other structures may refer to common designs.

For the sake of clarity, in the accompanying drawings used for describing the embodiments of the present disclosure, a thickness and dimension of a layer or a micro structure is enlarged. It may be understood that when an element such as a layer, a film, a region, or a substrate is described as being "on" or "under" another element, the element may be "directly" located "on" or "under" the other element, or there may be an intermediate element.

Although the implementations disclosed in the present disclosure are as above, the described contents are only implementations used for convenience of understanding the present disclosure and are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display substrate, comprising a pixel circuit and a scan drive circuit, wherein the pixel circuit comprises a write transistor and a scan signal line electrically connected with a control electrode of the write transistor; and the scan drive circuit comprises a first scan clock signal line and a second scan clock signal line;
   a signal of the first scan clock signal line is a first clock signal and a signal of the second scan clock signal line is a second clock signal, both of the first scan clock signal line and the second scan clock signal line are periodic clock signals; and
   a duration of the first clock signal being a low-level signal in one period of the first clock signal is different from a duration of the second clock signal being a low-level signal in one period of the second clock signal;
   wherein the scan drive circuit comprises N cascaded scan shift registers, wherein each of the scan shift registers receives the first clock signal and the second clock signal.

2. The display substrate of claim 1, wherein the second clock signal is a high-level signal when the first clock signal is a low-level signal, and the first clock signal is a high-level signal when the second clock signal is a low-level signal.

3. The display substrate of claim 1, wherein a duration of the first clock signal being a high-level signal in one period is greater than twice of the duration of the first clock signal being a low-level signal in one period; and
   a duration of the second clock signal being a high-level signal in one period is greater than twice of the duration of the second clock signal being a low-level signal in one period.

4. The display substrate of claim 1, wherein a period of the first clock signal is equal to a period of the second clock signal.

5. The display substrate of claim 1, wherein in a first time period, a rising edge of the second clock signal is earlier than a falling edge of the first clock signal, and a falling edge of the second clock signal is later than a rising edge of the first clock signal, wherein the first time period is a time period in which the second clock signal is a high-level signal; and
   in a second time period, the rising edge of the first clock signal is earlier than the falling edge of the second clock signal, and the falling edge of the first clock signal is later than the rising edge of the second clock signal, wherein the second time period is a time period in which the first clock signal is a high-level signal.

6. The display substrate of claim 1, wherein a scan shift register comprises an input terminal, an output terminal, a first clock signal terminal and a second clock signal terminal, and N is a total number of rows of pixel circuits;
   an output terminal of a scan shift register in an i-th stage is electrically connected with an input terminal of a scan shift register in an (i+1)-th stage and a scan signal line of a pixel circuit in the i-th row respectively, wherein 1≤i<N;
   a first clock signal terminal of a scan shift register in an s-th stage is electrically connected with the second scan clock signal line, a second clock signal terminal of the scan shift register in the s-th stage is electrically connected with the first scan clock signal line, a first clock signal terminal of a scan shift register in an (s+1)-th stage is electrically connected with the first scan clock signal line, a second clock signal terminal of the scan shift register in the (s+1)-th stage is electrically connected with the second scan clock signal line, wherein 1≤s<N and s is an odd number.

7. The display substrate of claim 6, wherein the duration of the first clock signal being a low-level signal in one period is greater than the duration of the second clock signal being a low-level signal in one period.

8. The display substrate of claim 7, wherein a difference between the duration of the first clock signal being a low-level signal in one period and the duration of the second clock signal being a low-level signal in one period is 0.08% to 3% of the period.

9. The display substrate of claim 8, wherein a difference between the duration of the first clock signal being a low-level signal in one period and the duration of the second clock signal being a low-level signal in one period may be about 0.05 microseconds to 0.15 microseconds; or
   the duration of the first clock signal being a low-level signal in one period is 30% to 35% of the period, and/or the duration of a second clock signal being a low-level signal in one period is 30% to 35% of the period.

10. The display substrate of claim 9, wherein the duration of the first clock signal being a low-level signal in one period is about 1.8 microseconds to 1.9 microseconds, and the duration of the first clock signal being a high-level signal in one period is about 3.7 microseconds to 3.8 microseconds; or
   the duration of the second clock signal being a low-level signal in one period is about 1.7 microseconds to 1.8 microseconds, and the duration of the second clock signal being a high-level signal in one period is about 3.8 microseconds to 3.9 microseconds.

11. The display substrate of claim 6, wherein the scan drive circuit further comprises a scan initial signal line electrically connected with an input terminal of a scan shift register in a first stage;
   when a signal of the scan initial signal line is a single pulse signal and the signal of the scan initial signal line is a low-level signal, for a portion of time the first clock signal is a high-level signal and the second clock signal is a low-level signal.

12. The display substrate of claim 11, wherein the duration of the signal of the scan initial signal line being a low-level signal is greater than the duration of the second clock signal being a high-level signal and is smaller than a period of the first clock signal or the second clock signal.

13. The display substrate of claim 12, wherein the duration of the signal of the scan initial signal line being a low-level signal is about 4.4 microseconds to 4.6 microseconds.

14. The display substrate of claim 6, further comprising a control drive circuit, wherein the pixel circuit further comprises a compensation transistor and a control signal line electrically connected with a control electrode of the compensation transistor, and the compensation transistor is of a transistor type different from the write transistor, the control drive circuit comprises control shift registers in N/2 stages, and a control shift register comprises an input terminal and an output terminal;

an output terminal of a control shift register in a j-th stage is electrically connected with a control signal line of a pixel circuit in a (2j−1)-th row, a control signal line of a pixel circuit in a 2j-th row and an input terminal of a control shift register in a (j+1)-th stage respectively, wherein 1≤j<N/2.

15. The display substrate of claim 14, wherein the pixel circuit further comprises an anode reset transistor, a node reset transistor and a reset signal line, the anode reset transistor is of a same transistor type as the write transistor, and the node reset transistor is of a same transistor type as the compensation transistor;

the scan signal line is electrically connected with a control electrode of the anode reset transistor, and the reset signal line is electrically connected with a control electrode of the node reset transistor;

the control drive circuit is electrically connected with reset signal lines of the pixel circuits in N rows; and end time when a signal of the reset signal line is an effective level signal is earlier than start time when a signal of a control signal line of a pixel circuit in a same row is an effective level signal.

16. The display substrate of claim 15, wherein a difference between the end time when the signal of the reset signal line is an effective level signal and the start time when the signal of the control signal line of the pixel circuit in the same row being an effective level signal is greater than a duration when the signal of the reset signal line of the pixel circuit in the same row is an effective level signal.

17. The display substrate of claim 14, further comprising a light emitting drive circuit, and the pixel circuit further comprises a light emitting transistor and a light emitting signal line electrically connected with a control electrode of the light emitting transistor, and the light emitting transistor is of a same transistor type as the write transistor;

the light emitting drive circuit comprises light emitting shift registers in N/2 stages, wherein a light emitting shift register comprises an input terminal and an output terminal;

an output terminal of a light emitting shift register in the j-th stage is electrically connected with a light emitting signal line of the pixel circuit in the (2j−1)-th row, a light emitting signal line of the pixel circuit in the 2j-th row and an input terminal of a light emitting shift register in the (j+1)-th stage respectively, wherein 1≤j<N/2.

18. The display substrate of claim 6, further comprising a control drive circuit, wherein the pixel circuit further comprises a compensation reset transistor and a control signal line electrically connected with a control electrode of the compensation reset transistor, and the compensation reset transistor is of a transistor type different from the write transistor, the control drive circuit comprises control shift registers in N/2 stages, wherein a control shift register comprises an input terminal and an output terminal;

an output terminal of a control shift register in a j-th stage is electrically connected with a control signal line of a pixel circuit in a (2j−1)-th row, a control signal line of a pixel circuit in a 2j-th row and an input terminal of a control shift register in a (j+1)-th stage respectively, wherein 1≤j<N/2.

19. The display substrate of claim 18, wherein the pixel circuit further comprises an anode reset transistor, a compensation transistor, a node reset transistor and a reset signal line; wherein the anode reset transistor, the compensation transistor and the node reset transistor are of a same transistor type as the write transistor;

the scan signal line is also electrically connected with a control electrode of the anode reset transistor and a control electrode of the compensation transistor;

the scan drive circuit is electrically connected with reset signal lines of the pixel circuits in N rows; and end time of a signal of the reset signal line being an effective level signal is earlier than start time of a signal of a scan signal line of a pixel circuit in a same row being an effective level signal.

20. A display device, comprising: the display substrate of claim 1.

* * * * *